(12) United States Patent
Parham et al.

(10) Patent No.: US 8,951,647 B2
(45) Date of Patent: Feb. 10, 2015

(54) ORGANIC ELECTROLUMINESCENCE DEVICE

(75) Inventors: Amir Hossain Parham, Frankfurt am Main (DE); Joachim Kaiser, Darmstadt (DE); Anja Gerhard, Egelsbach (DE); Jonas Valentin Kroeber, Frankfurt (DE)

(73) Assignee: Merck Patent GmbH, Darmstadt (DE)

( * ) Notice: Subject to any disclaimer, the term of this patent is extended or adjusted under 35 U.S.C. 154(b) by 472 days.

(21) Appl. No.: 12/999,792

(22) PCT Filed: Jul. 8, 2009

(86) PCT No.: PCT/EP2009/004954
§ 371 (c)(1),
(2), (4) Date: Dec. 17, 2010

(87) PCT Pub. No.: WO2010/015306
PCT Pub. Date: Feb. 11, 2010

(65) Prior Publication Data
US 2011/0121274 A1 May 26, 2011

(30) Foreign Application Priority Data
Aug. 8, 2008 (DE) .................... 10 2008 036 982

(51) Int. Cl.
*H01L 51/50* (2006.01)
*H01L 51/00* (2006.01)
*C09B 57/00* (2006.01)

(52) U.S. Cl.
CPC ........ *H01L 51/0067* (2013.01); *H01L 51/0058* (2013.01); *C09B 57/00* (2013.01); *H01L 51/5016* (2013.01); *Y10S 428/917* (2013.01)
USPC ........... 428/690; 428/917; 313/504; 313/505; 313/506; 257/40; 257/E51.05; 257/E51.026; 257/E51.032; 546/18; 546/24; 546/79; 546/81; 546/101; 548/304.1; 548/418; 548/440; 548/444

(58) Field of Classification Search
USPC .................. 428/690, 917; 313/504, 505, 506; 257/40, E51.026, E51.05, E51.032; 546/18, 24, 79, 81, 101; 544/234; 548/413, 440, 304.1, 41
See application file for complete search history.

(56) References Cited

U.S. PATENT DOCUMENTS

| 2004/0028944 | A1* | 2/2004 | Mori et al. ............... 428/691 |
| 2004/0147742 | A1* | 7/2004 | Wong et al. .............. 544/230 |
| 2004/0170863 | A1* | 9/2004 | Kim et al. ............... 428/690 |
| 2006/0115679 | A1 | 6/2006 | Chun et al. |
| 2006/0147752 | A1* | 7/2006 | Lee et al. ............... 428/690 |
| 2006/0199038 | A1 | 9/2006 | Lee |
| 2007/0051944 | A1 | 3/2007 | Vestweber et al. |
| 2009/0302752 | A1 | 12/2009 | Parham et al. |

FOREIGN PATENT DOCUMENTS

| JP | 2003-109767 A | 4/2003 | |
| JP | 2003-109768 | * 4/2003 | ............. H05B 33/22 |
| JP | 2003-109768 A | 4/2003 | |
| JP | 2006-156941 A | 6/2006 | |
| JP | 2006-245565 A | 9/2006 | |
| JP | 2007-223928 A | 9/2007 | |
| JP | 2009-184987 A | 8/2009 | |
| JP | 2009-266927 A | 11/2009 | |
| WO | WO-2005/053055 A1 | 6/2005 | |
| WO | WO-2008/086851 A1 | 7/2008 | |

OTHER PUBLICATIONS

Wu et al., Highy Bright Blue Organic Light-Emitting Devices using Spirobifluorene-Cored Conjugated Compounds, 2002, Applied Physics Letters, vol. 81, No. 4, pp. 577-579.*
Wu et al., Highly bright blue organic light-emitting devices using spirobifluoreene-cored conjugated compounds, 2002, Applied Physics Letters, vol. 81, No. 4, pp. 577-579.*
Shen, J.Y., et al., "High Tg blue emitting materials for electroluminescent devices," J. Mater. Chem. 2005, vol. 15, pp. 2455-2463.
Lee, R.-H., et al., "Efficient fluorescent red, green, and blue organic light-emitting devices with a blue host of spirobifluorene derivative," Thin Solid Films 2008, vol. 516, pp. 5062-5068.

* cited by examiner

*Primary Examiner* — Gregory Clark
(74) *Attorney, Agent, or Firm* — Drinker Biddle & Reath LLP

(57) ABSTRACT

The present invention relates to organic electroluminescent devices which comprise fluorene derivatives and spirobifluorene derivatives as matrix material for phosphorescent emitters.

20 Claims, No Drawings

ORGANIC ELECTROLUMINESCENCE DEVICE

CROSS-REFERENCE TO RELATED APPLICATIONS

This application is a national stage application (under 35 U.S.C. §371) of PCT/EP2009/004954, filed Jul. 8, 2009, which claims benefit of German application 10 2008 036 982.9, filed Aug. 8, 2008.

BACKGROUND OF THE INVENTION

The present invention relates to phosphorescent organic electroluminescent devices which comprise fluorene and spirobifluorene derivatives as matrix materials.

Organic semiconductors are being developed for a number of electronic applications of different types. The structure of organic electroluminescent devices (OLEDs) in which these organic semiconductors are employed as functional materials is described, for example, in U.S. Pat. No. 4,539,507, U.S. Pat. No. 5,151,629, EP 0676461 and WO 98/27136. However, further improvements are still necessary. Thus, there is still a need for improvement, in particular with respect to the lifetime, efficiency and operating voltage of organic electroluminescent devices. It is furthermore necessary for the compounds to have high thermal stability and a high glass-transition temperature and to be capable of sublimation without decomposition.

Especially in the case of phosphorescent electroluminescent devices, improvements in the above-mentioned properties are still necessary. In particular, there is a need for improvement in the case of matrix materials for phosphorescent emitters which simultaneously result in good efficiency, a long lifetime and a low operating voltage. These very properties of the matrix materials are frequently limiting for the lifetime and efficiency of the organic electroluminescent device.

In accordance with the prior art, carbazole derivatives, for example bis-(carbazolyl)biphenyl, are frequently used as matrix materials. There is still a need for improvement here, in particular with respect to the lifetime and glass-transition temperature of the materials.

Furthermore, ketones (WO 04/093207), phosphine oxides and sulfones (WO 05/003253) are used as matrix materials for phosphorescent emitters. Low operating voltages and long lifetimes are achieved, in particular, with ketones. There is still a need for improvement here, in particular with respect to the efficiency and compatibility with metal complexes which contain ketoketonate ligands, for example acetylacetonate.

Furthermore, metal complexes, for example BAlq or bis[2-(2-benzothiazole)phenolate]zinc(II), are used as matrix materials for phosphorescent emitters. There is still a need for improvement here, in particular with respect to the operating voltage and the chemical stability. Purely organic compounds are frequently more stable than these metal complexes. Thus, some of these metal complexes are hydrolysis-sensitive, which makes handling of the complexes more difficult.

In particular, there is still a need for improvement in the case of matrix materials for phosphorescent emitters which simultaneously result in high efficiencies, long lifetimes and low operating voltages and which are also compatible with phosphorescent emitters which carry ketoketonate ligands.

Surprisingly, it has been found that fluorene derivatives and corresponding heterocyclic derivatives which are substituted by triazine or other electron-deficient nitrogen heterocycles, in particular spirobifluorene derivatives, are very highly suitable as matrix materials for phosphorescent emitters and result, in this use, in OLEDs which simultaneously have high efficiencies, long lifetimes and low operating voltages, including with phosphorescent emitters which contain ketoketonate ligands.

U.S. Pat. No. 6,229,012 and U.S. Pat. No. 6,225,467 disclose the use of fluorene derivatives which are substituted by triazine groups as electron-transport material in OLEDs. However, the application does not reveal that these materials are also suitable as matrix materials for phosphorescent emitters.

WO 05/053055 discloses the use of triazine derivatives, in particular spirobifluorene derivatives, which are substituted by triazine groups as hole-blocking material in phosphorescent OLEDs. However, the application does not reveal that these materials are also suitable as matrix materials for phosphorescent emitters.

BRIEF SUMMARY OF THE INVENTION

The invention thus relates to an organic electroluminescent device comprising, in at least one emitting layer,
(A) at least one phosphorescent compound and
(B) at least one compound of the formula (1) or formula (2):

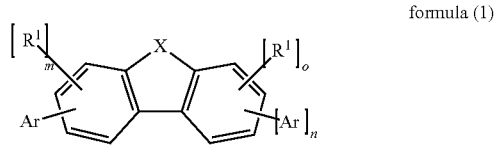

formula (1)

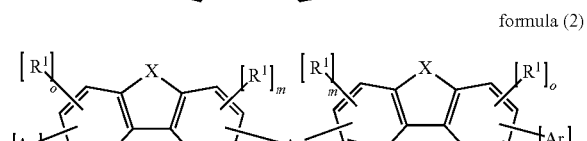

formula (2)

where the following applies to the symbols and indices used:
Ar is on each occurrence, identically or differently, a heteroaryl group selected from the group consisting of triazine, pyrazine, pyrimidine, pyridazine, pyridine, pyrazole, imidazole, oxazole, oxadiazole and thiazole, each of which may be substituted by one or more groups $R^1$;
X is on each occurrence, identically or differently, a group of the formula (3), where the dashed bond in each case indicates the bonding to the two benzene rings:

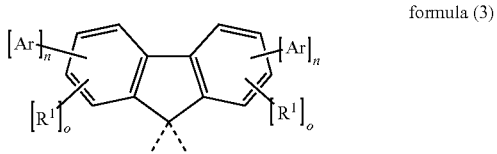

formula (3)

or X is, identically or differently on each occurrence, a divalent bridge selected from $B(R^1)$, $C(R^1)_2$, $Si(R^1)_2$, $C=C(R^1)_2$, O, S, S=O, $SO_2$, $N(R^1)$, $P(R^1)$ and $P(=O)R^1$;
$R^1$ is on each occurrence, identically or differently, H, D, F, Cl, Br, I, CHO, $N(Ar^1)_2$, $C(=O)Ar^1$, $P(=O)(Ar^1)_2$, $S(=O)Ar^1$, $S(=O)_2Ar^1$, $CR^2=CR^2Ar^1$, CN, $NO_2$, $Si(R^2)_3$, $B(OR^2)_2$, $B(R^2)_2$, $B(N(R^2)_2)_2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more, preferably non-adjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms may be replaced by D, F, Cl, Br, I, CN or $NO_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or a combination of these systems; two or more adjacent substituents $R^1$ here may also form a mono- or polycyclic, aliphatic or aromatic ring system with one another;

$Ar^1$ is on each occurrence, identically or differently, an aromatic or heteroaromatic ring system having 5 to 30 aromatic ring atoms, which may be substituted by one or more radicals $R^2$; two radicals $Ar^1$ here which are bonded to the same nitrogen, phosphorus or boron atom may also be linked to one another by a single bond or a bridge selected from $B(R^2)$, $C(R^2)_2$, $Si(R^2)_2$, $C=O$, $C=NR^2$, $C=C(R^2)_2$, O, S, $S=O$, $SO_2$, $N(R^2)$, $P(R^2)$ and $P(=O)R^2$;

$R^2$ is on each occurrence, identically or differently, H, D or an aliphatic, aromatic and/or heteroaromatic hydrocarbon radical having 1 to 20 C atoms, in which, in addition, H atoms may be replaced by D or F; two or more adjacent substituents $R^2$ here may also form a mono- or polycyclic, aliphatic or aromatic ring system with one another;

n is 0 or 1;

m is 0, 1, 2 or 3;

o is 0, 1, 2, 3 or 4 if n=0 and is 0, 1, 2 or 3 if n=1.

DETAILED DESCRIPTION OF THE INVENTION

An organic electroluminescent device is taken to mean a device which comprises anode, cathode and at least one emitting layer which is arranged between the anode and the cathode, where at least one layer between the anode and cathode comprises at least one organic or organometallic compound. At least one emitting layer here comprises at least one phosphorescent emitter and at least one compound of the above-mentioned formula (1) or (2). An organic electroluminescent device does not necessarily have to comprise only layers built up from organic or organometallic materials. Thus, it is also possible for one or more layers to comprise inorganic materials or to be built up entirely from inorganic materials.

For the purposes of this invention, a phosphorescent compound is a compound which exhibits luminescence from an excited state of relatively high spin multiplicity, i.e. a spin state>1, in particular from an excited triplet state, at room temperature. For the purposes of this invention, all luminescent iridium and platinum compounds, in particular, are to be regarded as phosphorescent compounds.

For the purposes of this invention, an aryl group contains at least 6 C atoms; for the purposes of this invention, a heteroaryl group contains at least 2 C atoms and at least 1 heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, pyrene, quinoline, isoquinoline, etc.

For the purposes of this invention, an aromatic ring system contains at least 6 C atoms in the ring system. For the purposes of this invention, a heteroaromatic ring system contains at least 2 C atoms and at least 1 heteroatom in the ring system, with the proviso that the sum of C atoms and heteroatoms is at least 5. The heteroatoms are preferably selected from N, O and/or S. For the purposes of this invention, an aromatic or heteroaromatic ring system is intended to be taken to mean a system which does not necessarily contain only aryl or heteroaryl groups, but instead in which a plurality of aryl or heteroaryl groups may also be interrupted by a short non-aromatic unit (preferably less than 10% of the atoms other than H), such as, for example, an $sp^3$- or $sp^2$-hybridised C, N or O atom. Thus, for example, systems such as 9,9'-spirobifluorene, 9,9-diarylfluorene, triarylamine, diaryl ether, stilbene, benzophenone, etc., are also intended to be taken to be aromatic ring systems for the purposes of this invention. Likewise, an aromatic or heteroaromatic ring system is taken to mean systems in which a plurality of aryl or heteroaryl groups are linked to one another by single bonds, for example biphenyl, terphenyl or bipyridine.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, tert-pentyl, 2-pentyl, cyclopentyl, n-hexyl, s-hexyl, t-hexyl, 2-hexyl, 3-hexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, heptynyl or octynyl. A $C_1$- to $C_{40}$-alkoxy group is particularly preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the radicals R mentioned above and may be linked to the aromatic or heteroaromatic group via any desired positions, is taken to mean, in particular, groups derived from benzene, naphthalene, anthracene, phenanthrene, benzanthracene, pyrene, chrysene, perylene, fluoranthene, benzofluoranthene, naphthacene, pentacene, benzopyrene, biphenyl, biphenylene, terphenyl, terphenylene, fluorene, benzofluorene, dibenzofluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The compounds of the formulae (1) and (2) preferably have a glass-transition temperature $T_G$ of greater than 70° C., particularly preferably greater than 90° C., very particularly preferably greater than 110° C.

In a preferred embodiment of the invention, the group X stands, identically or differently on each occurrence, for a group of the formula (3) or for a divalent bridge selected from $C(R^1)_2$, $Si(R^1)_2$ and $NR^1$. In a particularly preferred embodiment of the invention, the group X stands for a group of the formula (3) or for $C(R^1)_2$.

The compound of the formula (1) is thus particularly preferably either a spirobifluorene derivative if the group X stands for a group of the formula (3) or a fluorene derivative if the group X stands for $C(R^1)_2$. Likewise, the compound of the formula (2) is particularly preferably a spirobifluorene derivative, a fluorene derivative or a compound which contains a spirobifluorene group and a fluorene group. The fluorene derivatives of the formulae (4) and (5) and the spirobifluorene derivatives of the formulae (6) and (7) are therefore a particularly preferred embodiment of the invention:

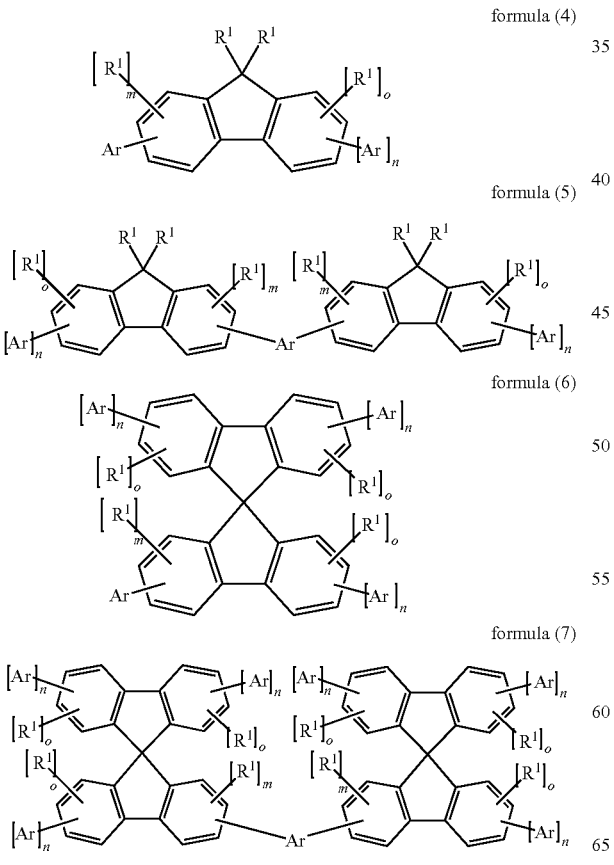

where the symbols and indices used have the same meanings as described above.

The group Ar represents an electron-deficient heteroaromatic group. The group Ar preferably stands, identically or differently on each occurrence, for a 6-membered heteroaromatic ring, i.e. for triazine, pyrazine, pyrimidine, pyridazine or pyridine, each of which may be substituted by one or more radicals $R^1$.

In a preferred embodiment of the invention, the monovalent group Ar in compounds of the formulae (1), (2) and (4) to (7) is selected from the groups of the following formulae (8) to (20), where the dashed bond in each case indicates the bonding of the group to the fluorene or spirobifluorene or to the corresponding heterocyclic derivative, and $R^1$ has the same meaning as described above:

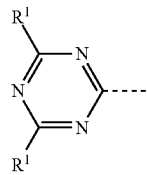

formula (8)

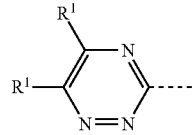

formula (9)

formula (10)

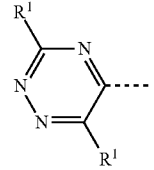

formula (11)

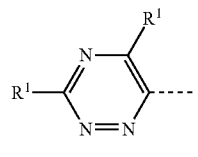

formula (12)

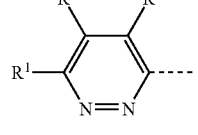

formula (13)

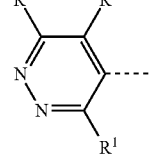

formula (14)

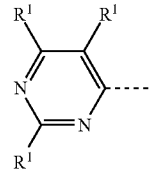

formula (15)
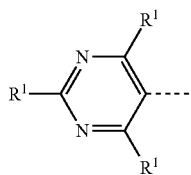

formula (16)
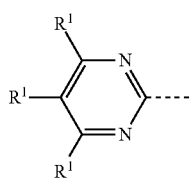

formula (17)
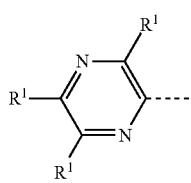

formula (18)
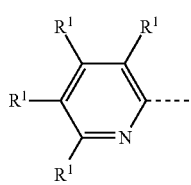

formula (19)
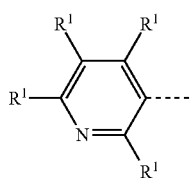

formula (20)
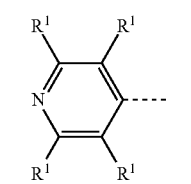

formula (22)
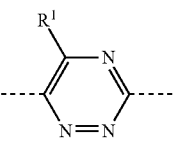

formula (23)
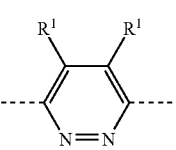

formula (24)
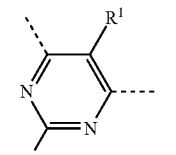

formula (25)
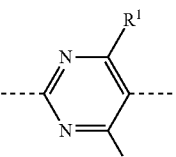

formula (26)
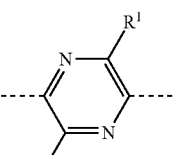

formula (27)
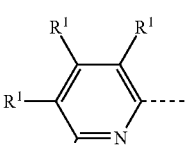

formula (28)
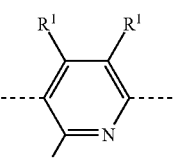

In a preferred embodiment of the invention, the divalent group Ar in compounds of the formulae (2) and (7) is selected from the groups of the following formulae (21) to (28), where the dashed bonds in each case indicate the bonding of the group to the fluorene or spirobifluorene or the corresponding heterocyclic derivative, and $R^1$ has the same meaning as described above:

formula (21)
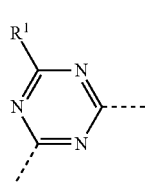

In a preferred embodiment of the invention, the group Ar contains two or three nitrogen atoms. Preferred monovalent groups Ar are therefore the groups of the formulae (8) to (17), and preferred divalent groups Ar are the groups of the formulae (21) to (26). The group Ar particularly preferably contains three nitrogen atoms. Particularly preferred monovalent groups Ar are therefore the groups of the formulae (8) to (11), in particular the group of the formula (8), and particularly preferred divalent groups Ar are the groups of the formulae (21) and (22), in particular the group of the formula (21).

In a further preferred embodiment of the invention, the radical $R^1$ which is bonded to the groups of the formulae (8) to (28) stands, identically or differently on each occurrence, for H, D, a straight-chain alkyl or alkoxy group having 1 to 10 C atoms or a branched or cyclic alkyl or alkoxy group having 3 to 10 C atoms, each of which may be substituted by one or more radicals R², where one or more H atoms may be replaced by D or F, or an aromatic or heteroaromatic ring system having 5 to 30 aromatic ring atoms, which may in each case be substituted by one or more radicals R², or a combination of these systems. In a particularly preferred embodiment of the invention, the radical R¹ which is bonded to the groups of the formulae (8) to (28) stands, identically or differently on each occurrence, for H or D, a straight-chain alkyl group having 1 to 5 C atoms or a branched or cyclic alkyl group having 3 to 6 C atoms, each of which may be substituted by one or more radicals R², where one or more H atoms may be replaced by D or F, or for an aromatic or heteroaromatic ring system having 5 to 25 aromatic ring atoms, which may in each case be substituted by one or more radicals R², or a combination of these systems. The radical R¹ which is bonded to the groups of the formulae (8) to (28) very particularly preferably stands, identically or differently on each occurrence, for H or D or for an aromatic or heteroaromatic ring system having 5 to 14 aromatic ring atoms, which may in each case be substituted by one or more radicals R² in particular for phenyl, naphthyl or biphenyl, each of which may be substituted by one or more radicals R², but is preferably unsubstituted.

In a further preferred embodiment of the invention, the radical R¹ which is bonded directly to the fluorene or spirobifluorene or the corresponding heterocyclic compound stands, identically or differently on each occurrence, for H, a straight-chain alkyl or alkoxy group having 1 to 10 C atoms or a branched or cyclic alkyl or alkoxy group having 3 to 10 C atoms, each of which may be substituted by one or more radicals R², where one or more H atoms may be replaced by D or F, or an aromatic or heteroaromatic ring system having 5 to 30 aromatic ring atoms, which may in each case be substituted by one or more radicals R², or a combination of these systems. In a particularly preferred embodiment of the invention, the radical R¹ which is bonded directly to the fluorene or spirobifluorene or the corresponding heterocyclic compound stands, identically or differently on each occurrence, for H, a straight-chain alkyl group having 1 to 5 C atoms or a branched or cyclic alkyl group having 3 to 6 C atoms, each of which may be substituted by one or more radicals R², where one or more H atoms may be replaced by D or F, or for an aromatic or heteroaromatic ring system having 5 to 25 aromatic ring atoms, which may in each case be substituted by one or more radicals R².

In a further preferred embodiment of the invention, the group Ar is bonded in the 2-position of the fluorene or spirobifluorene or of the corresponding heterocycle. If more than one group Ar is present, the other groups Ar are preferably bonded in the 7-position and, in spirobifluorene derivatives, also in the 2'-position and 7'-position. Particularly preferred compounds of the formulae (1), (2) and (4) to (7) are therefore the compounds of the formulae (29) to (32):

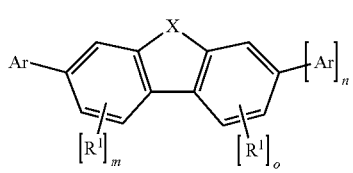

formula (29)

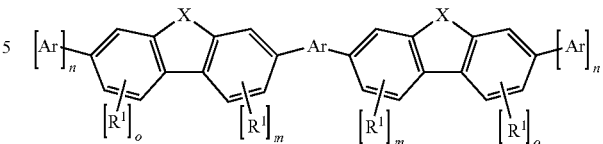

formula (30)

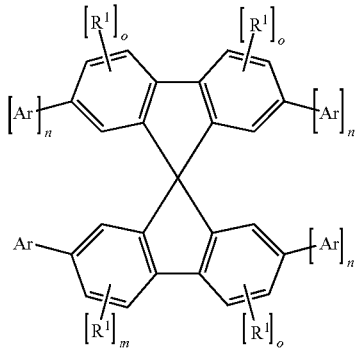

formula (31)

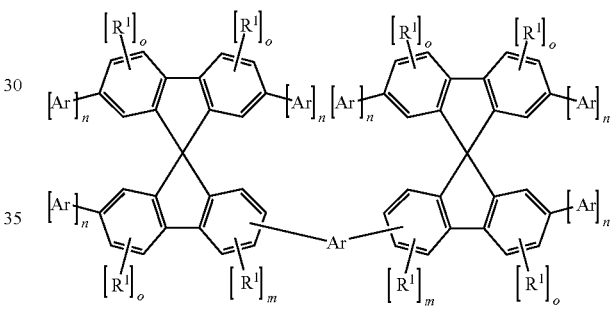

formula (32)

where the symbols and indices have the same meaning as described above, and where, for n=0, a substituent R¹ may also be bonded in the corresponding position. A preferred embodiment of the compounds of the formulae (29) and (30) are compounds in which X stands for C(R¹)₂.

In a preferred embodiment of compounds of the formulae (1), (2), (4) to (7) and (29) to (32), the index m=0, i.e. no further substituent apart from the group Ar is bonded to this benzene ring.

In a further preferred embodiment of compounds of the formulae (1), (2), (4) to (7) and (29) to (32), the sum of the indices n+o=0 or 1 on each benzene ring, i.e. a maximum of one group Ar or a maximum of one radical R¹ is bonded to each benzene ring.

Preferred embodiments of the compounds of the formulae (29) to (32) are compounds in which the group Ar stands for a group of the formulae (8) to (28) indicated above.

In a very particularly preferred embodiment of the invention, the group Ar in the compounds of the formulae (29) to (32) stands for a group of the formula (8) or formula (21). Furthermore particularly preferably in these compounds, m=0 and n+o=0 or 1 on each benzene ring. Very particular preference is therefore given to the compounds of the formulae (33) to (36):

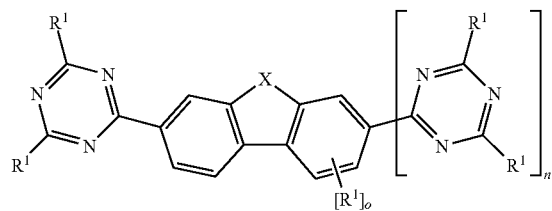

formula (33)

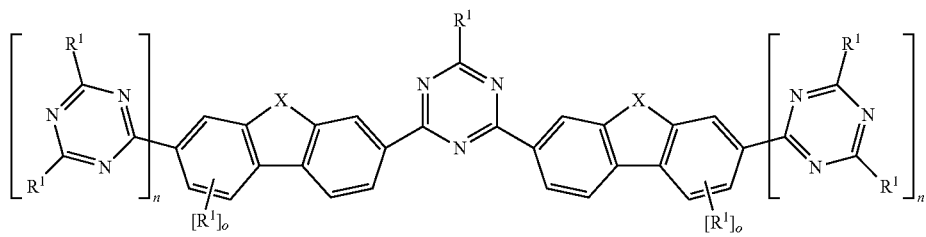

formula (34)

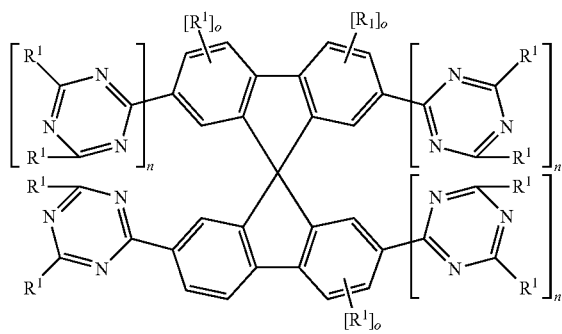

formula (35)

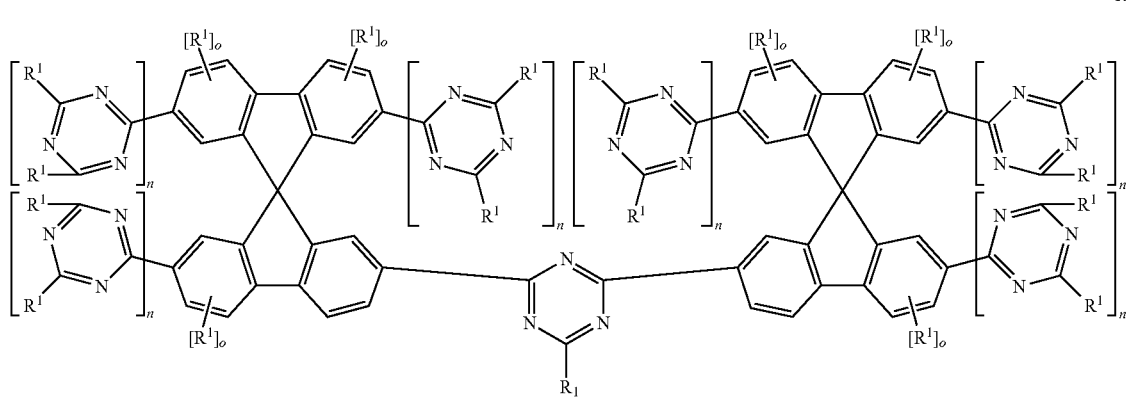

formula (36)

where the symbols and indices used have the meanings mentioned above, and furthermore n+o=0 or 1 on each benzene ring and where, for n=0 and o=1, the radical $R^1$ may be bonded to any desired free site on the benzene ring. Preferred embodiments of compounds of the formulae (33) and (34) are those in which X stands for $C(R^1)_2$.

Particular preference is given to the spirobifluorene derivatives of the formulae (35) and (36), in particular the spirobifluorene derivative of the formula (35). The compounds of the formula (35) very particularly preferably contain one or two triazine groups. The compounds of the formula (35) are thus particularly preferably selected from compounds of the formulae (37), (38) and (39):

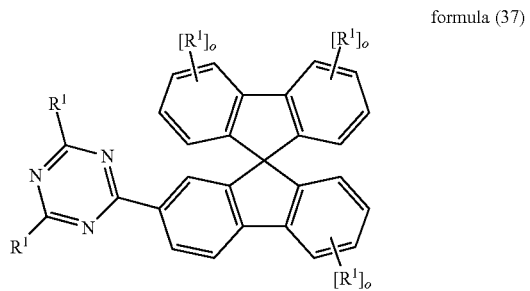

formula (37)

formula (38)
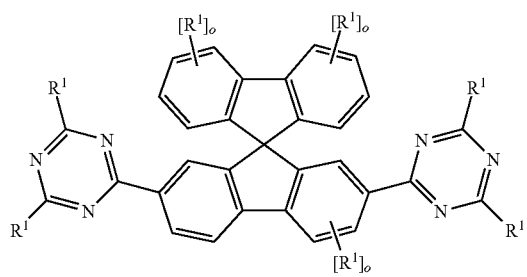
formula (39)
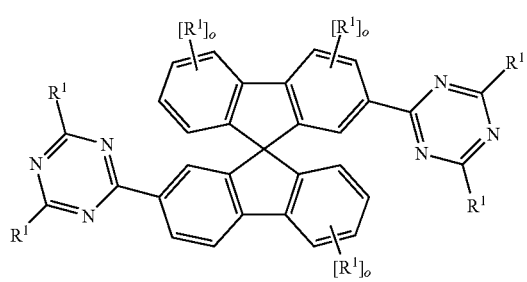
where the symbols used have the meanings mentioned above and o stands, identically or differently on each occurrence, for 0 or 1.
Examples of preferred compounds of the formulae (1), (2), (4) to (7) and (29) to (39) are structures (1) to (96) depicted below.
(1)
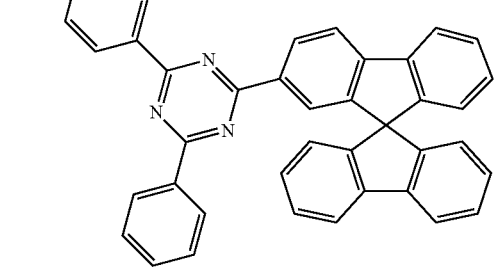
(2)
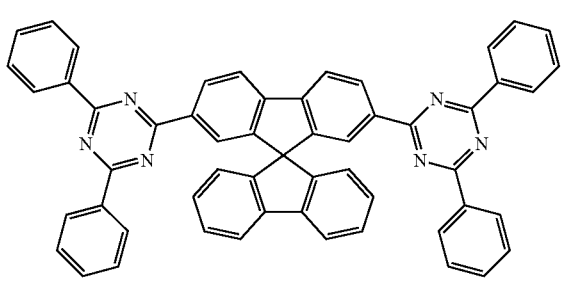
(3)
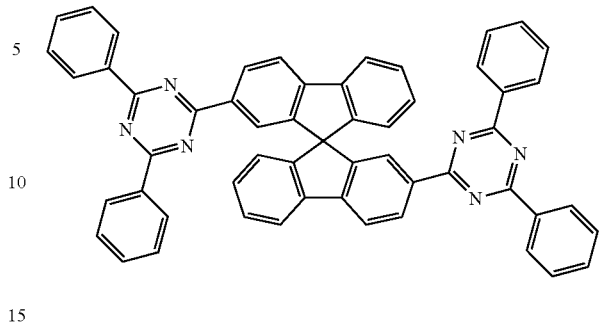
(4)
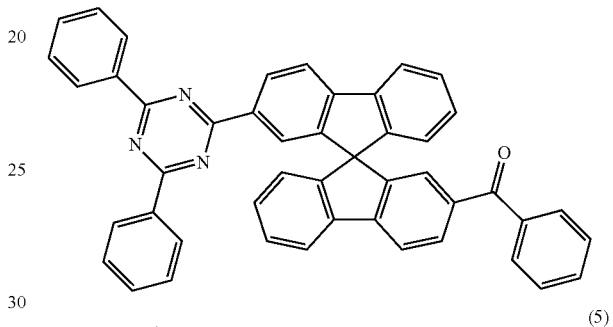
(5)
(6)
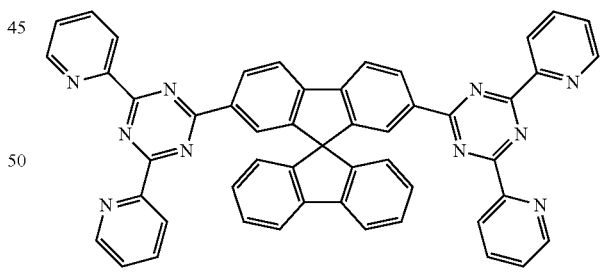
(7)
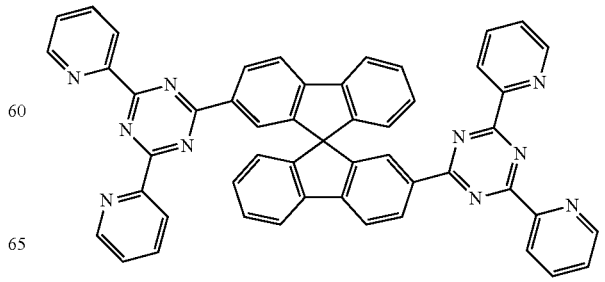

(8)
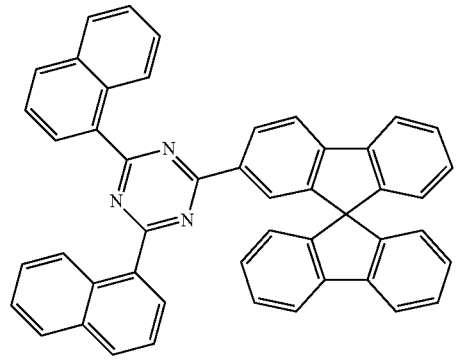
(12)
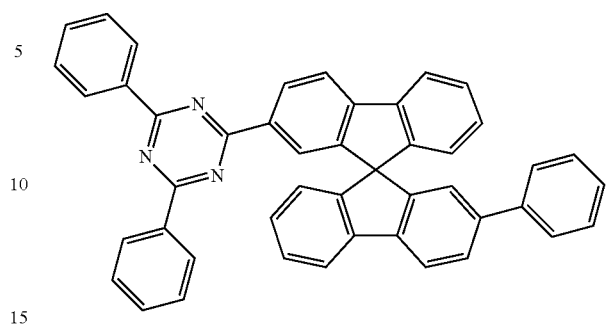
(9)
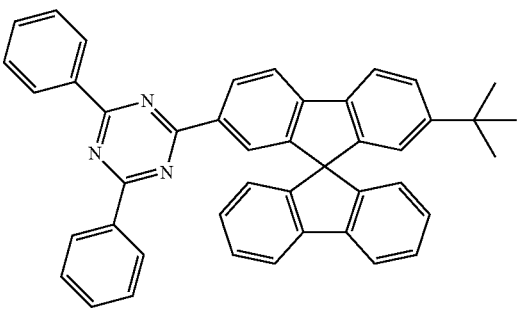
(13)
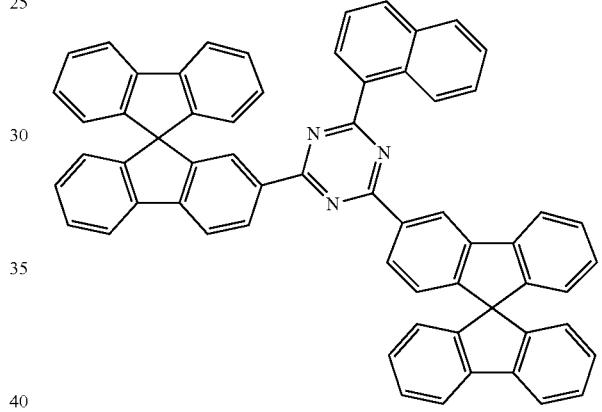
(10)
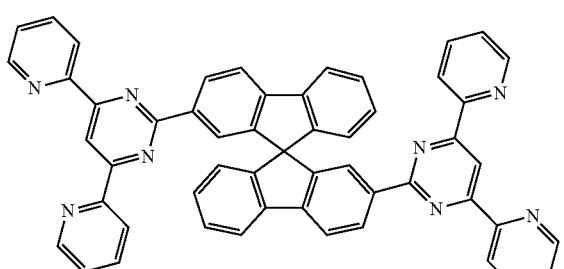
(11)
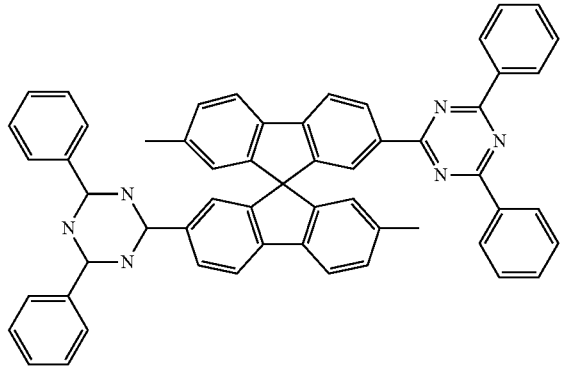
(14)

-continued
(15)
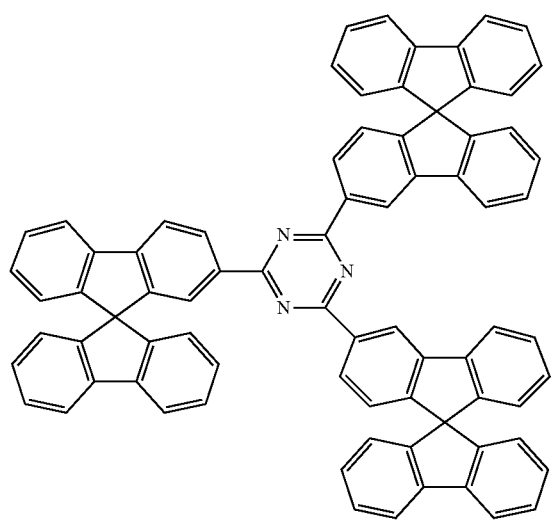
(16)
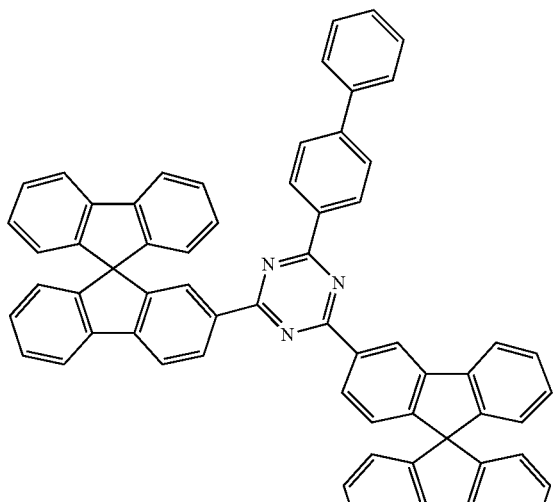
(17)
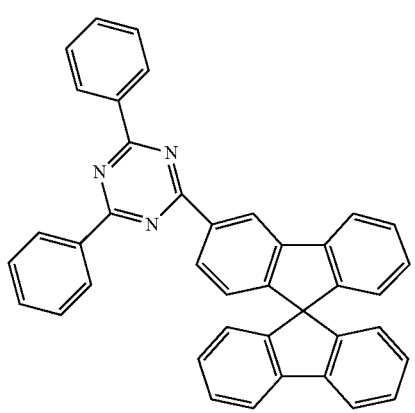
-continued
(18)
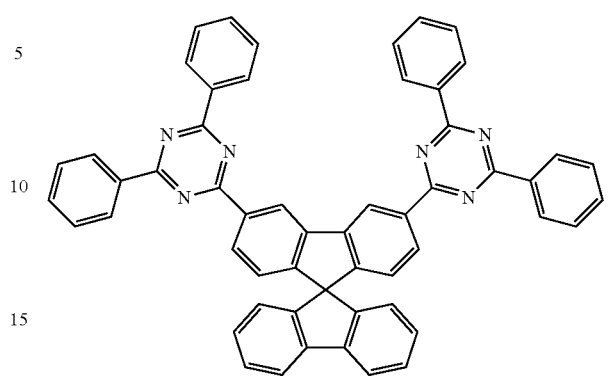
(19)
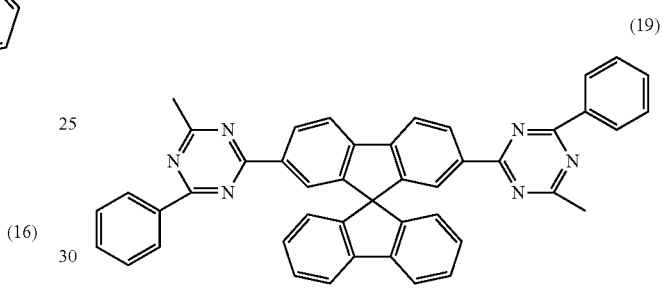
(20)
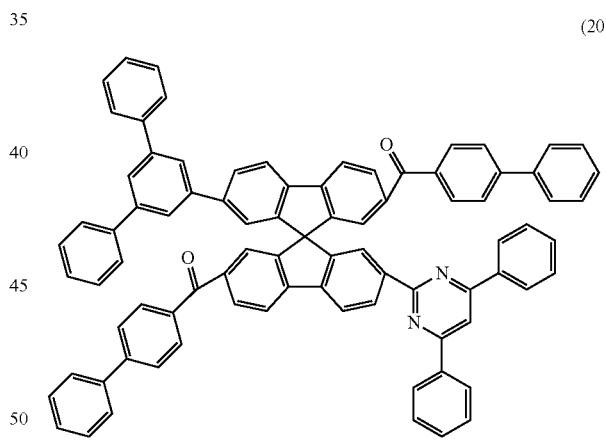
(21)
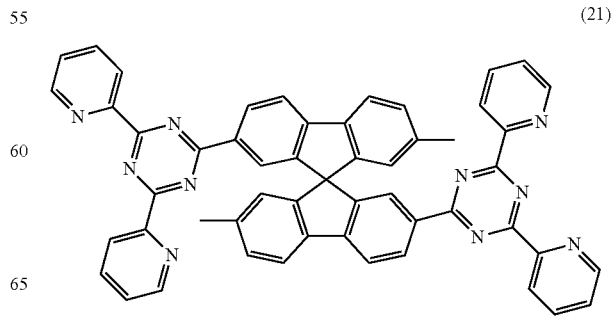

(22)
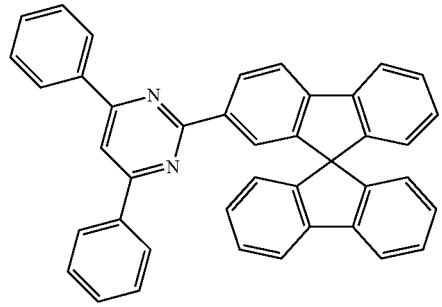
(23)
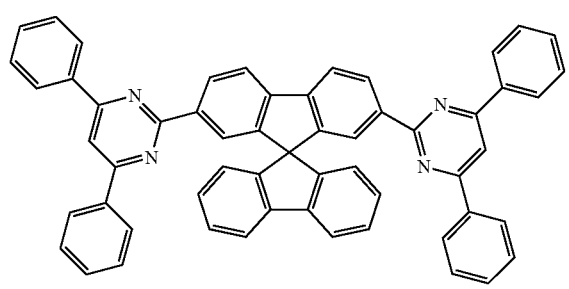
(24)
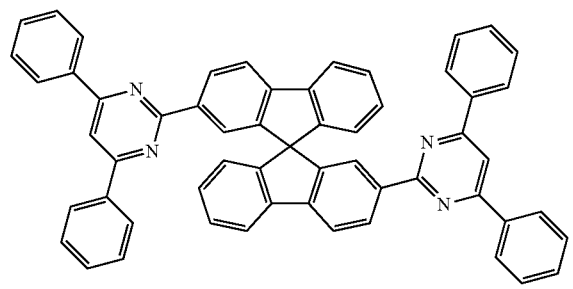
(25)
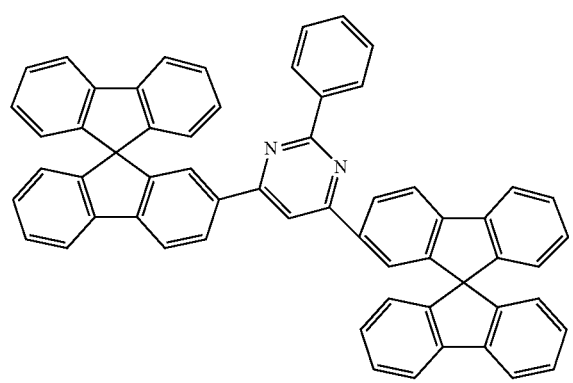
(26)
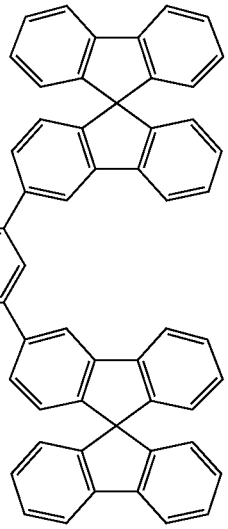
(27)
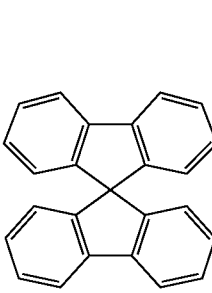
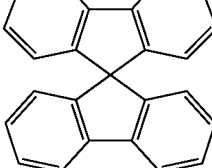
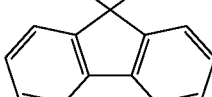
(28)
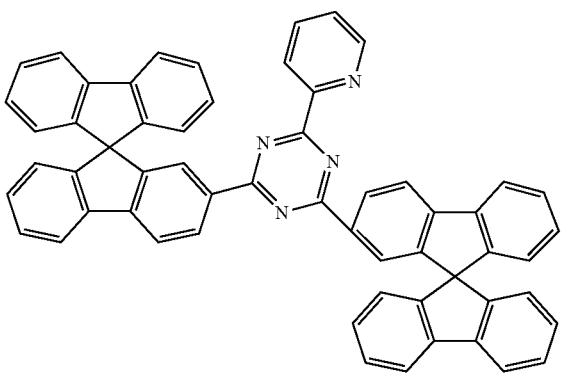
(29)
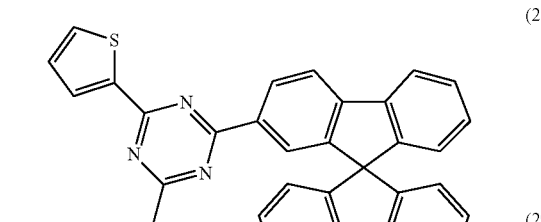
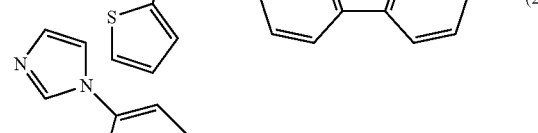
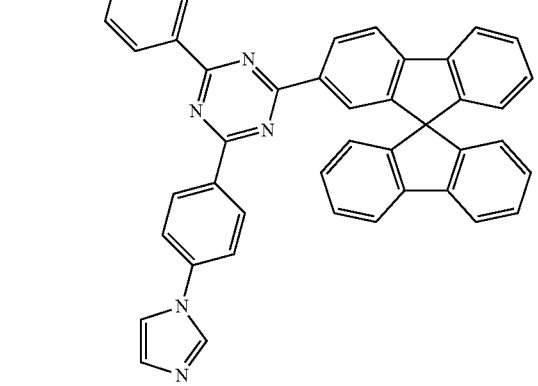

(30)
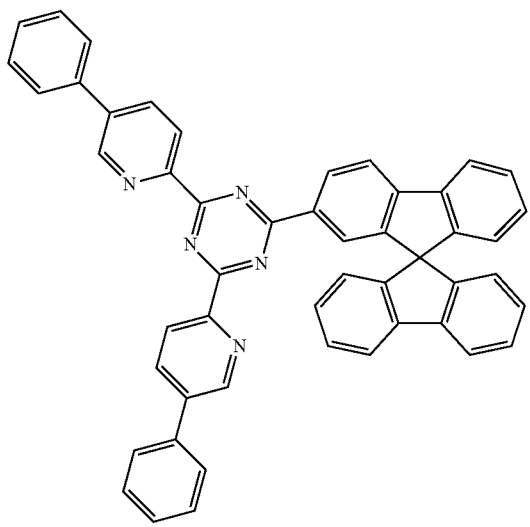
(31)
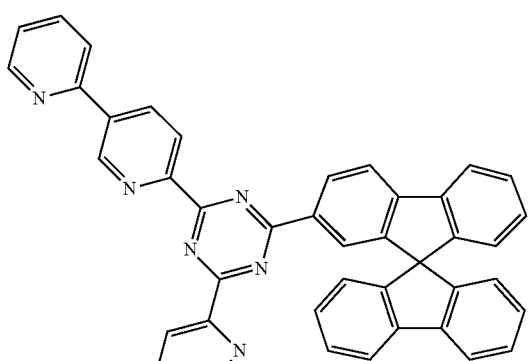
(32)
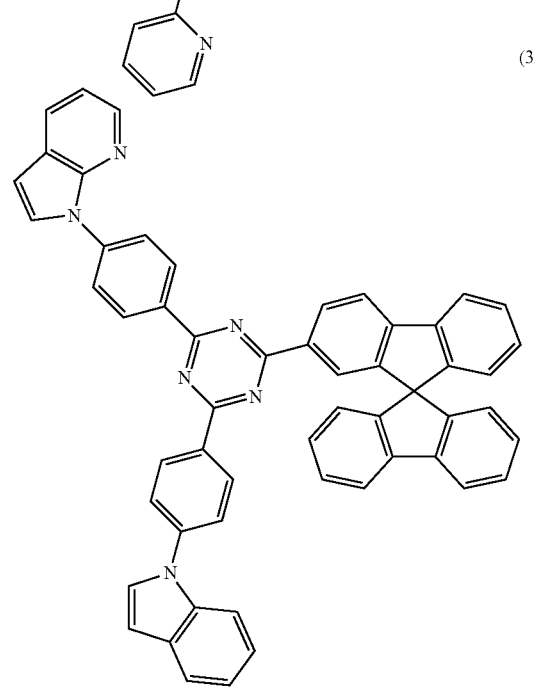
(33)
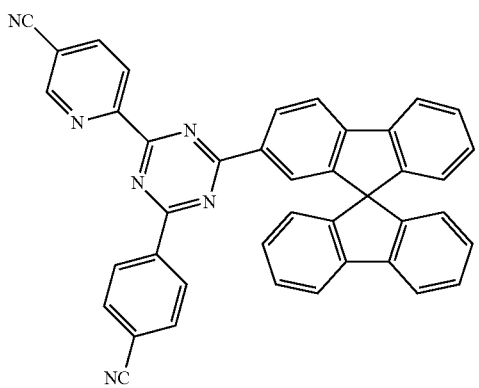
(34)
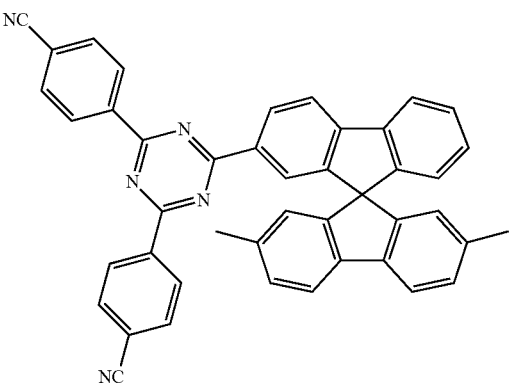
(35)
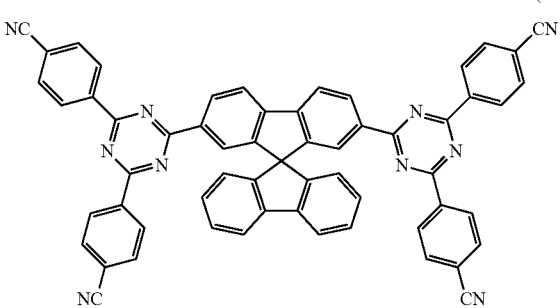
(36)
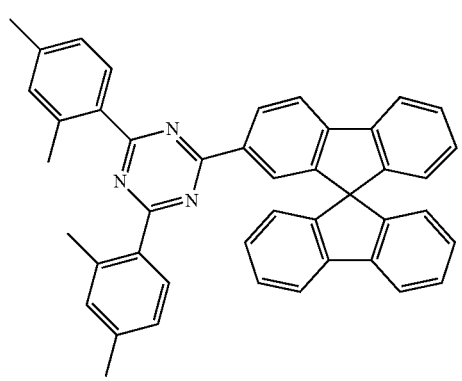

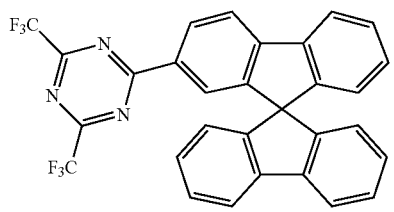
(37)
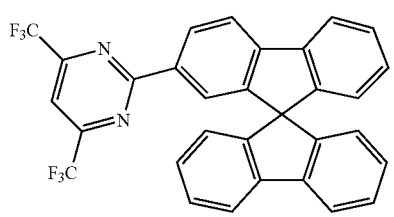
(38)
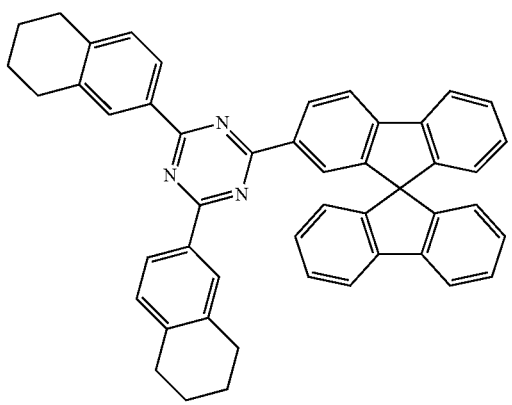
(39)
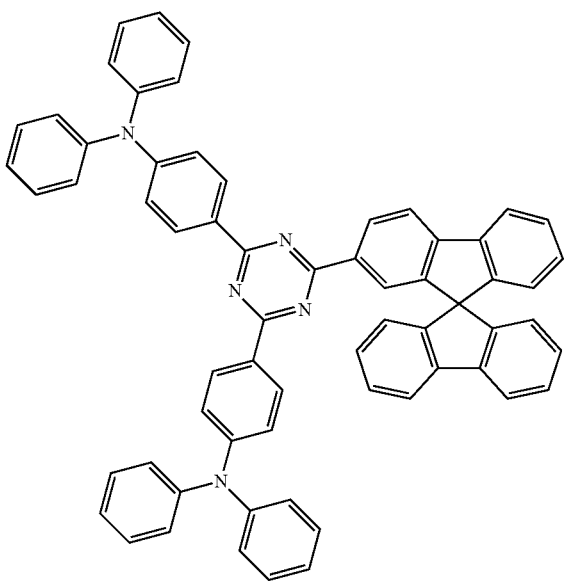
(40)
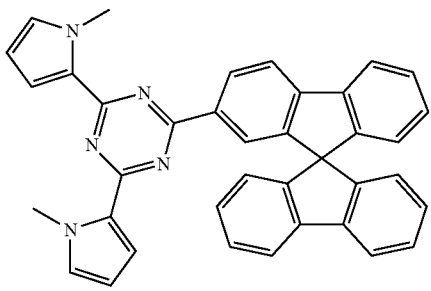
(41)
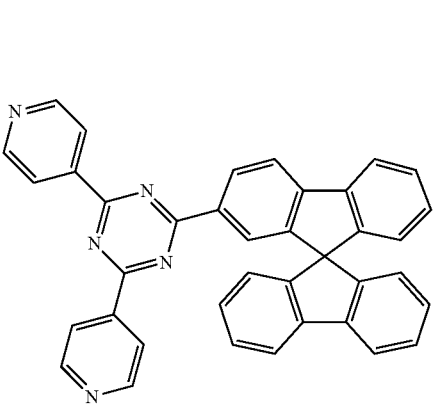
(42)
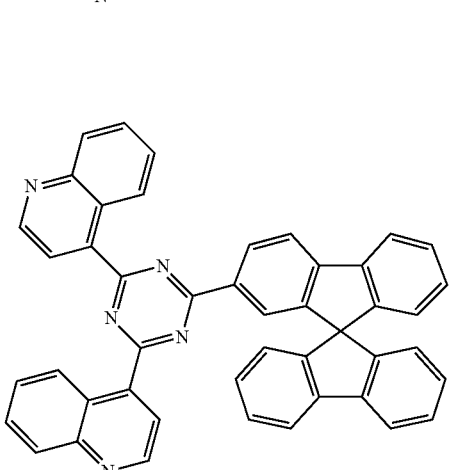
(43)
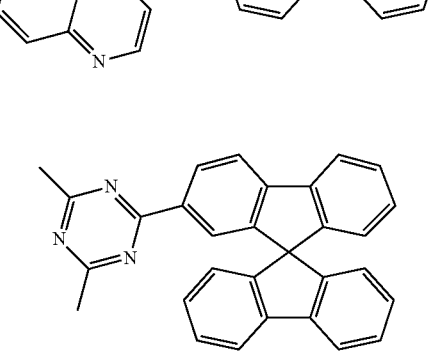
(44)
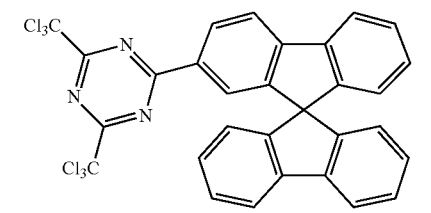
(45)

-continued
(46)
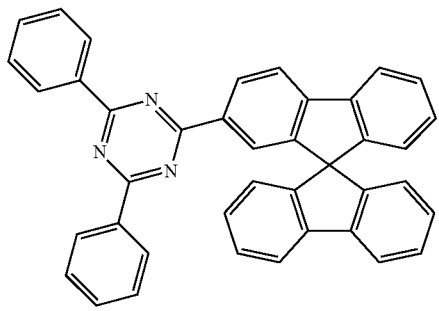
(47)
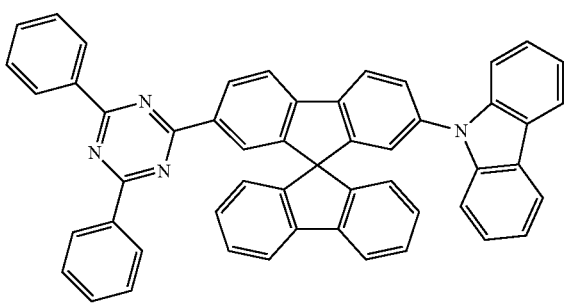
(48)
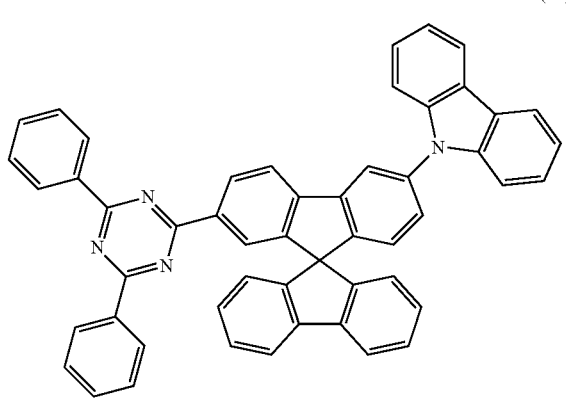
(49)
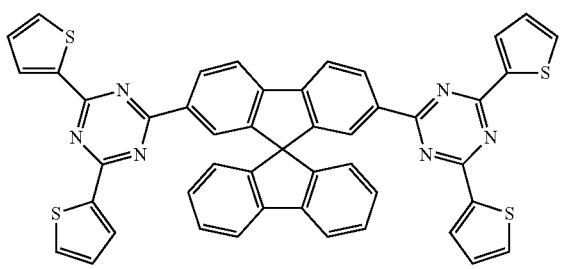
-continued
(50)
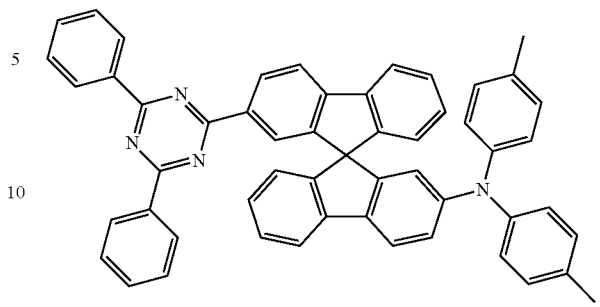
(51)
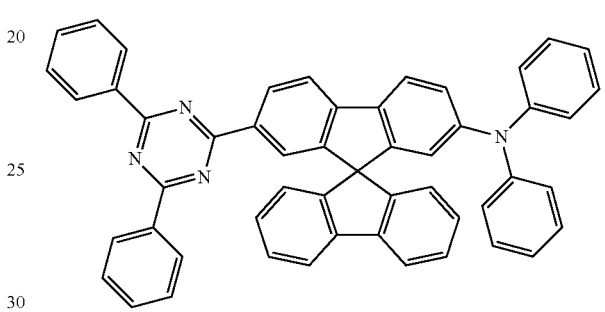
(52)
(53)

(54)
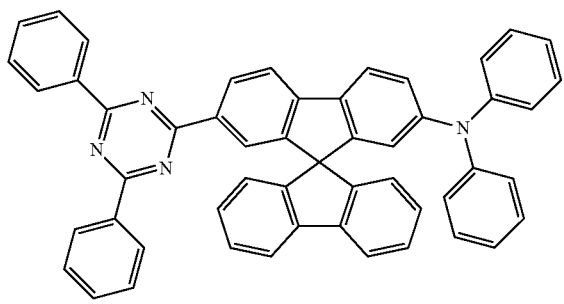
(55)
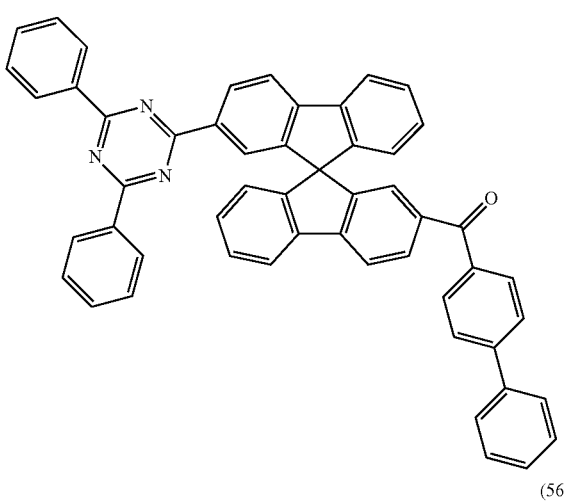
(56)
(57)
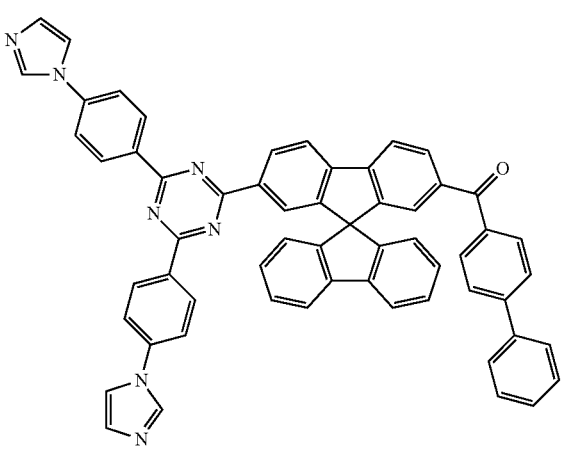
(58)
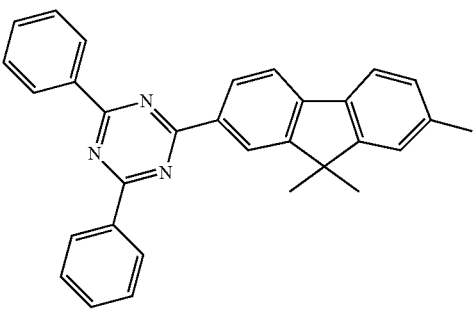
(59)
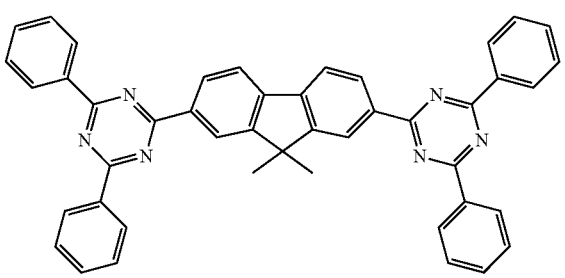
(60)
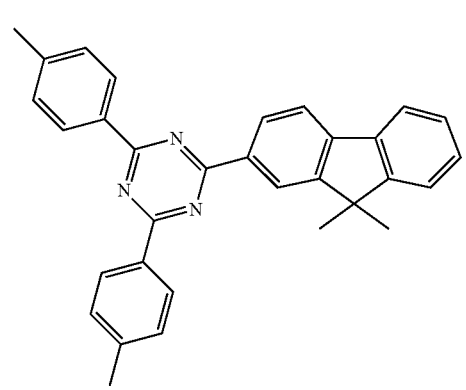
(61)
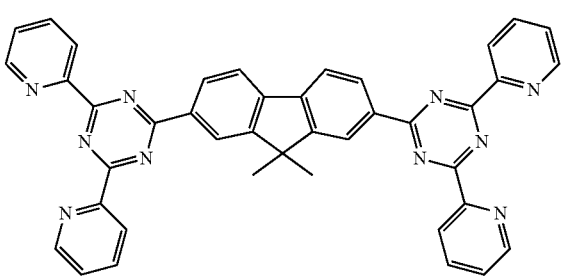
(62)
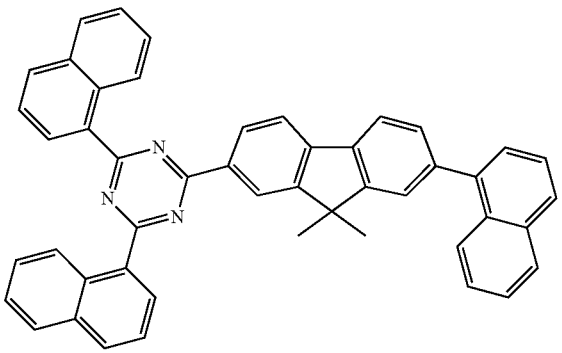

(63)
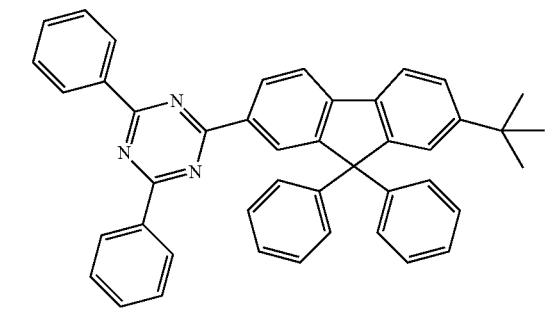
(64)
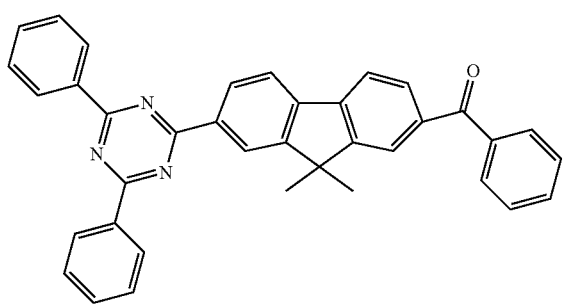
(65)
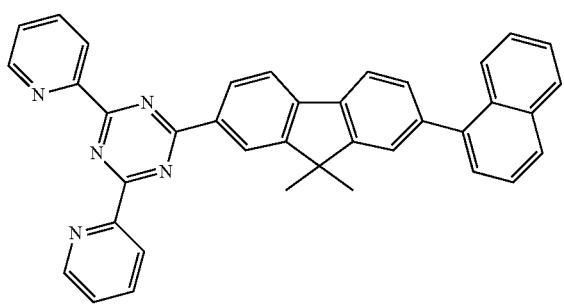
(66)
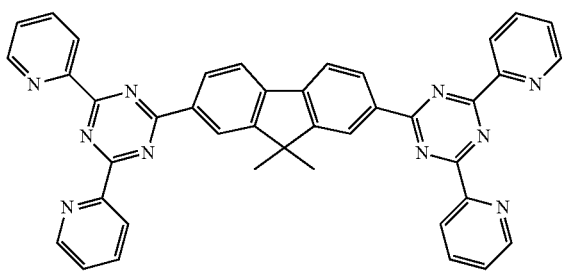
(67)
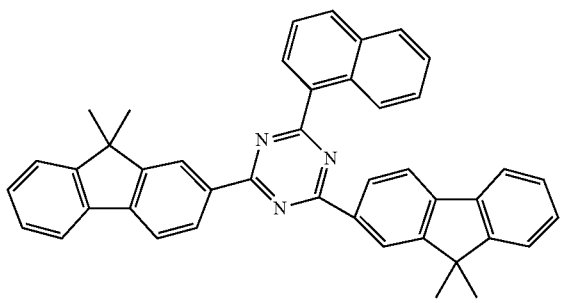
(68)
(69)
(70)
(71)

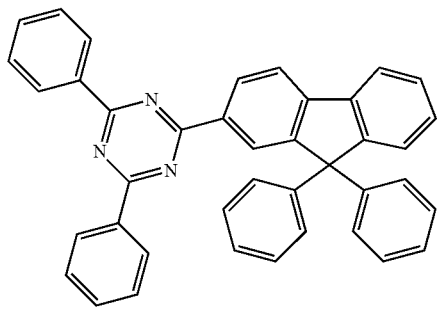
(72)
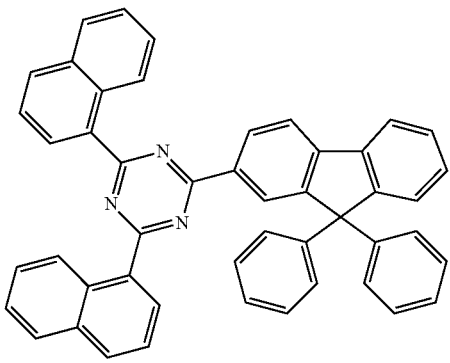
(77)
(73)
(78)
(74)
(79)
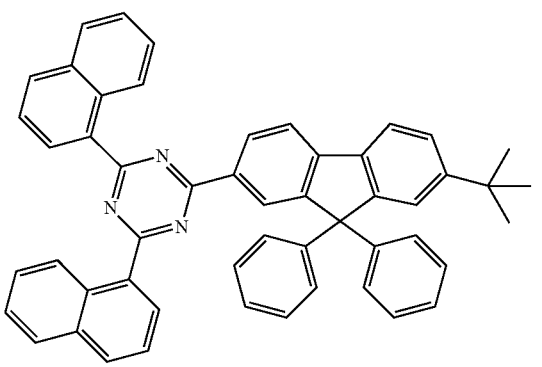
(75)
(76)
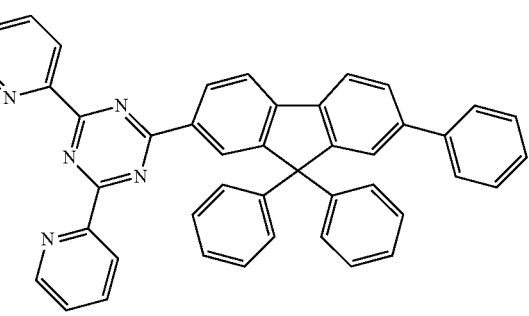
(80)
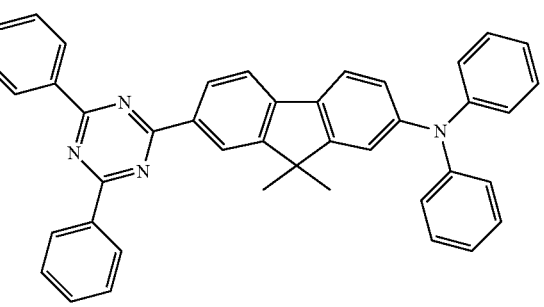

(81) 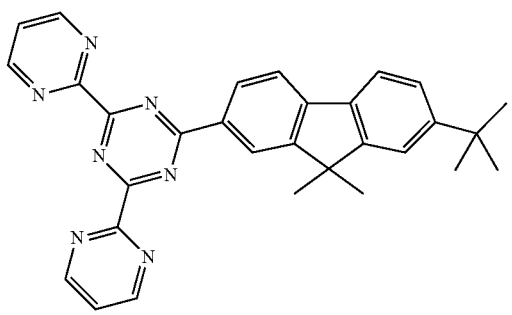
(82) 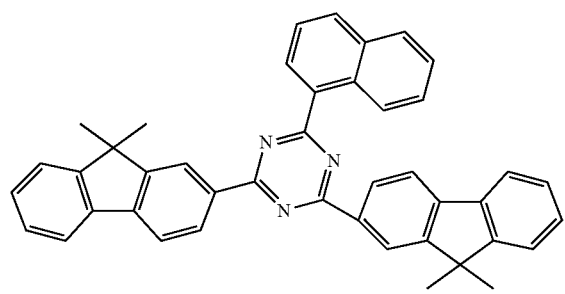
(83) 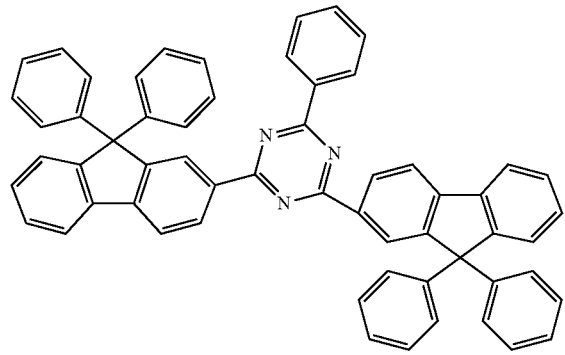
(84) 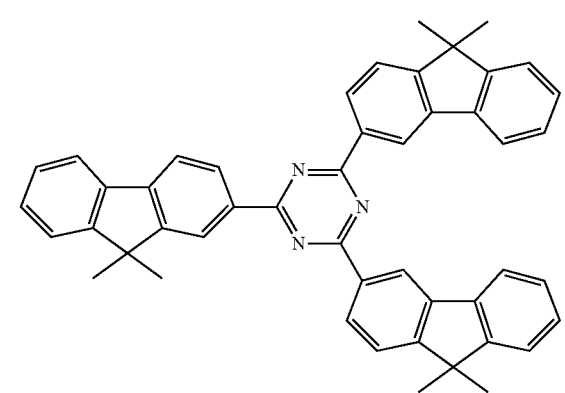
(85) 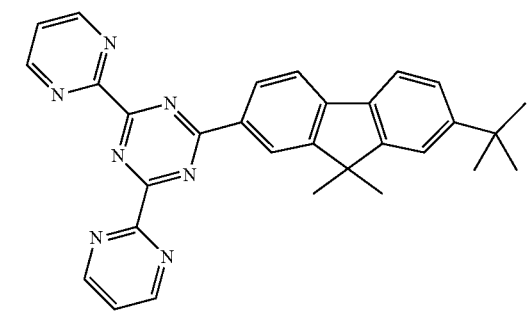
(86) 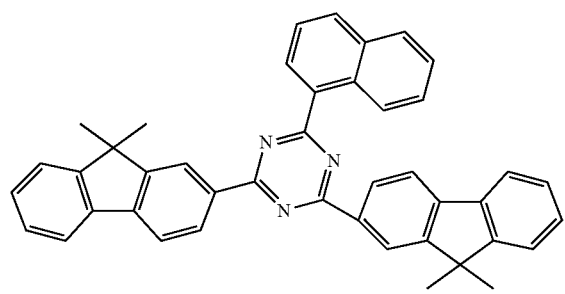
(87) 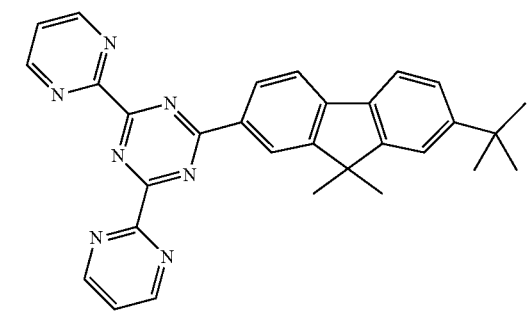
(88) 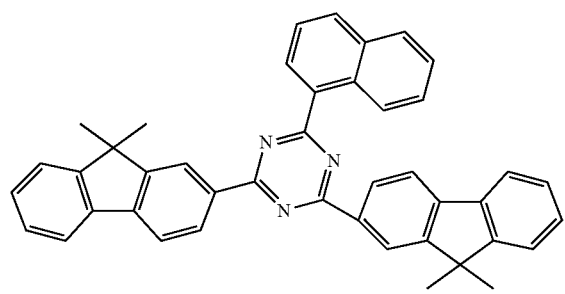

(89) 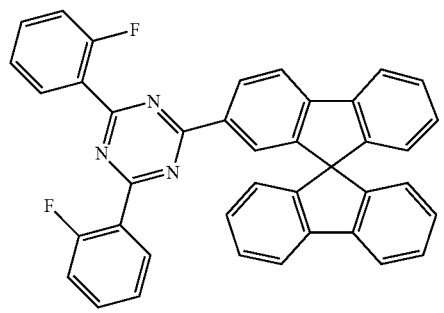

(90) 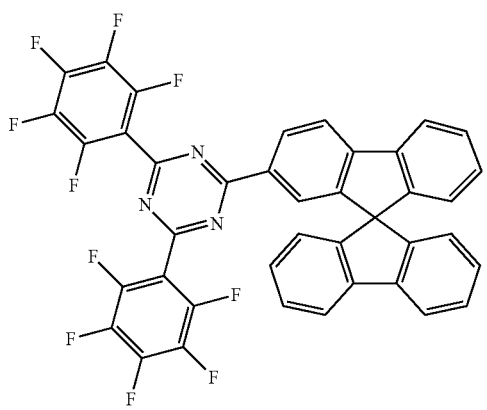

(91) 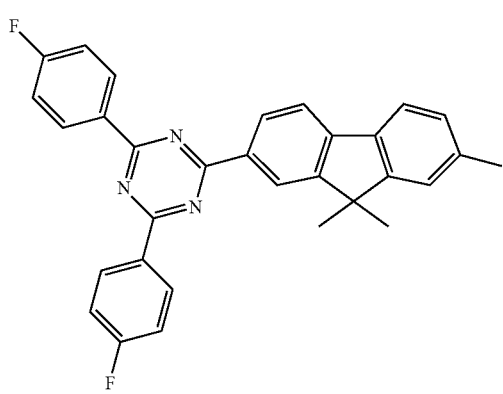

(92) 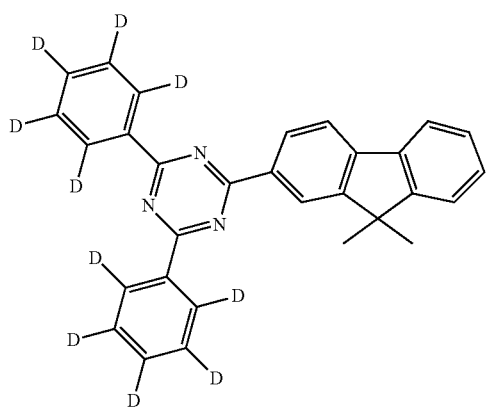

(93) 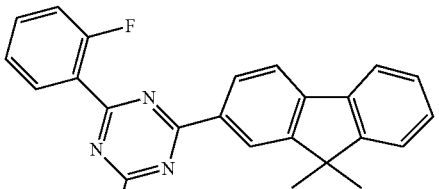

(94) 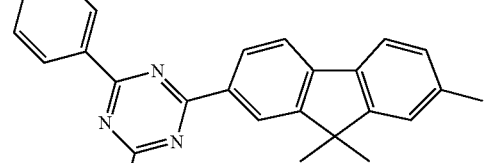

(95) 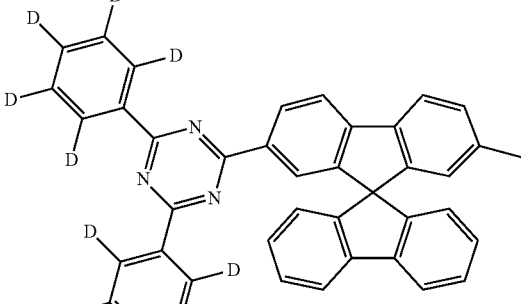

(96) 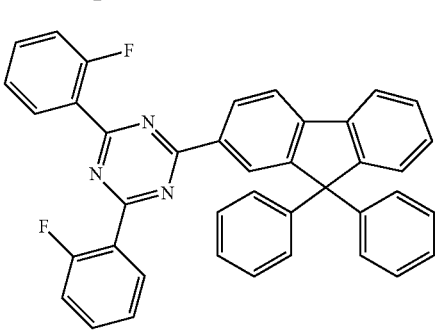

The compounds of the formula (1) can be synthesised, for example, by the processes described in U.S. Pat. No. 6,229, 012, U.S. Pat. No. 6,225,467 and WO 051053055. In general, metal-catalysed coupling reactions are suitable for the synthesis of the compounds, in particular the Suzuki coupling, as shown in Scheme 1 below for the example of the triazine. Thus, a fluorene, spirobifluorene or other heterocyclic derivative, each of which is substituted by a boronic acid or a boronic acid derivative, can be coupled with palladium catalysis to the group Ar which is substituted by one reactive leaving group for compounds of the formula (1) and by two reactive leaving groups for compounds of the formula (2). Suitable reactive leaving groups are, for example, halogens, in particular chlorine, bromine and iodine, triflate or tosylate.

Scheme 1:

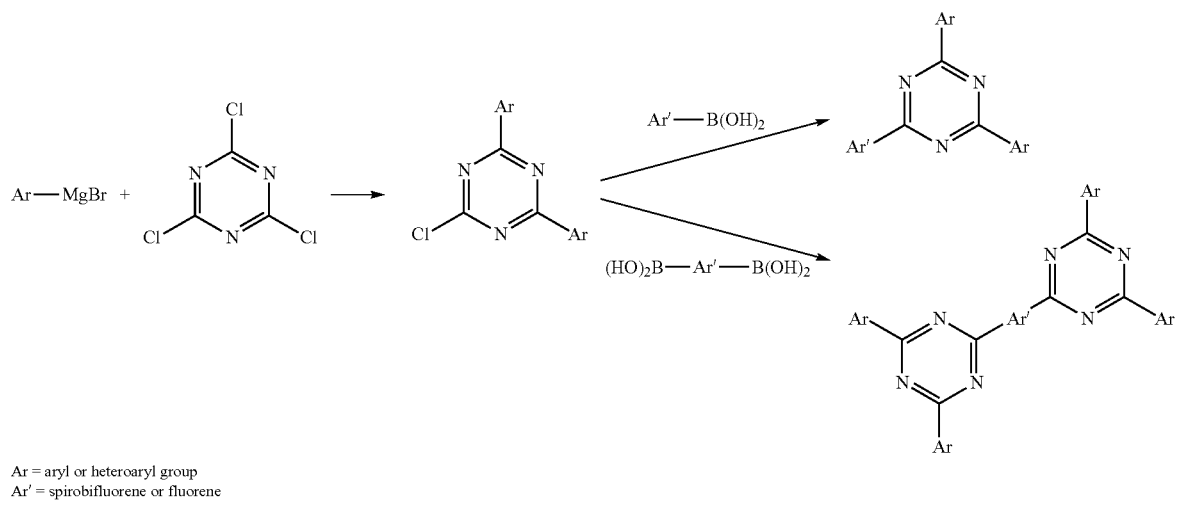

Ar = aryl or heteroaryl group
Ar' = spirobifluorene or fluorene

As described above, the compounds of the formulae (1) and (2) are used as matrix materials for phosphorescent emitters.

Suitable phosphorescent compounds are, in particular, compounds which emit light, preferably in the visible region, on suitable excitation and in addition contain at least one atom having an atomic number of greater than 20, preferably greater than 38 and less than 84, particularly preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium or platinum.

Particularly preferred organic electroluminescent devices comprise, as phosphorescent emitters, at least one compound of the formulae (40) to (43):

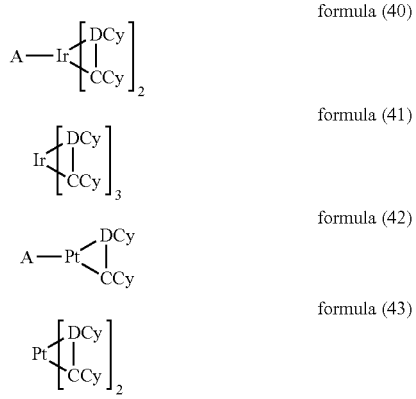

formula (40)
formula (41)
formula (42)
formula (43)

where $R^1$ has the same meaning as described above for formulae (1) and (2), and the following applies to the other symbols used:
DCy is, identically or differently on each occurrence, a cyclic group which contains at least one donor atom, preferably nitrogen, carbon in the form of a carbene or phosphorus, via which the cyclic group is bonded to the metal and which may in turn carry one or more substituents $R^1$; the groups DCy and CCy are bonded to one another via a covalent bond;
CCy is, identically or differently on each occurrence, a cyclic group which contains a carbon atom via which the cyclic group is bonded to the metal and which may in turn carry one or more substituents $R^1$;
A is, identically or differently on each occurrence, a monoanionic, bidentate chelating ligand, preferably a diketonate ligand.

A bridge may also be present between the groups DCy and CCy due to the formation of ring systems between a plurality of radicals $R^1$.

Examples of the emitters described above are revealed by the applications WO 00/70655, WO 01/41512, WO 02/02714, WO 02/15645, EP 1191613, EP 1191612, EP 1191614 and WO 05/033244. In general, all phosphorescent complexes as are used in accordance with the prior art for phosphorescent OLEDs and as are known to the person skilled in the art in the area of organic electroluminescence are suitable, and the person skilled in the art will be able to use further phosphorescent complexes without inventive step.

Apart from the cathode, anode and one or more emitting layers, the organic electroluminescent device may also comprise further layers. These are selected, for example, from in each case one or more hole-injection layers, hole-transport layers, hole-blocking layers, electron-transport layers, electron-injection layers, electron-blocking layers, exciton-blocking layers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. In addition, interlayers which control the charge balance in the device may be present. Furthermore, the layers, in particular the charge-transport layers, may also be doped. The doping of the layers may be advantageous for improved charge transport. However, it should be pointed out that each of these layers does not necessarily have to be present and the choice of layers is always dependent on the compounds used.

In a further preferred embodiment of the invention, the organic electroluminescent device comprises a plurality of emitting layers, where at least one emitting layer comprises at least one compound of the formula (1) or formula (2) and at least one phosphorescent emitter. These emission layers particularly preferably have in total a plurality of emission maxima between 380 nm and 750 nm, resulting overall in white emission, i.e. various emitting compounds which are able to fluoresce or phosphoresce and which emit blue and yellow, orange or red light are used in the emitting layers. Particular preference is given to three-layer systems, i.e. systems having three emitting layers, where at least one of these layers comprises at least one compound of the formula (1) or formula (2) and at least one phosphorescent emitter and where the three layers exhibit blue, green and orange or red emission (for the basic structure, see, for example, WO 05/011013). The use of more than three emitting layers may also be preferred. Likewise suitable for white emission are emitters which have broad-band emission bands and thus exhibit white emission.

The emitting layer which comprises the mixture of the compound of the formula (1) or formula (2) and the phosphorescent emitter preferably comprises between 99 and 50% by vol., preferably between 98 and 50% by vol., particularly preferably between 97 and 60% by vol., in particular between 95 and 85% by vol., of the compound of the formula (1) or formula (2), based on the entire mixture of emitter and matrix material. Correspondingly, the mixture comprises between 1 and 50% by vol., preferably between 2 and 50% by vol., particularly preferably between 3 and 40% by vol., in particular between 5 and 15% by vol., of the phosphorescent emitter, based on the entire mixture of emitter and matrix material.

Preference is furthermore also given to the use of a plurality of matrix materials as a mixture, where one matrix material is selected from compounds of the formula (1) or (2). The compounds of the formula (1) and formula (2) have predominantly electron-transporting properties due to the electron-deficient nitrogen heterocycles Ar. If a mixture of two or more matrix materials is used, a further component of the mixture is therefore preferably a hole-transporting compound. Preferred hole-conducting matrix materials are triarylamines, carbazole derivatives, for example CBP (N,N-biscarbazolyl-biphenyl) or the carbazole derivatives disclosed in WO 05/039246, US 2005/0069729, JP 2004/288381, EP 1205527 or WO 08/086,851, azacarbazoles, for example in accordance with EP 1617710, EP 1617711, EP 1731584, JP 2005/347160, bipolar matrix materials, for example in accordance with WO 07/137,725, and 9,9-diarylfluorene derivatives, for example in accordance with the unpublished application DE 102008017591.9. The mixture of matrix materials may also comprise more than two matrix materials. It is furthermore also possible to use the matrix material of the formula (1) or formula (2) as a mixture with a further electron-transporting matrix material. Preferred further electron-transporting matrix materials are ketones, for example in accordance with WO 04/093207, tetraaryl ketones, for example in accordance with DE 102008033943.1, phosphine oxides, sulfoxides and sulfones, for example in accordance with WO 05/003253, oligophenylenes, bipolar matrix materials, for example in accordance with WO 07/137,725, silanes, for example in accordance with WO 05/111172,9,9-diarylfluorene derivatives (for example in accordance with the unpublished application DE 102008017591.9), azaboroles or boronic esters (for example in accordance with WO 06/117052).

Preference is furthermore given to an organic electroluminescent device, characterised in that one or more layers are applied by means of a sublimation process, in which the materials are vapour-deposited in vacuum sublimation units at an initial pressure of less than $10^{-5}$ mbar, preferably less than $10^{-6}$ mbar. However, it should be noted that the pressure may also be even lower, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds are necessary for this purpose. High solubility can be achieved through suitable substitution of the compounds. Not only solutions of individual materials, but also solutions comprising a plurality of compounds, for example matrix materials and dopants, can be applied here.

The organic electroluminescent device can also be produced as a hybrid system by applying one or more layers from solution and vapour-depositing one or more other layers. Thus, for example, it is possible to apply an emitting layer comprising a compound of the formula (1) or (2) and a phosphorescent dopant from solution and to apply a hole-blocking layer and/or an electron-transport layer on top by vacuum vapour deposition. The emitting layer comprising a compound of the formula (1) or (2) and a phosphorescent dopant can likewise be applied by vacuum vapour deposition and one or more other layers can be applied from solution.

These processes are generally known to the person skilled in the art and can be applied by him without problems to organic electroluminescent devices comprising compounds of the formula (1) or (2) or the preferred embodiments mentioned above.

The present invention furthermore relates to mixtures comprising at least one phosphorescent emitter and at least one compound of the formula (1) or formula (2).

The invention furthermore relates to solutions comprising a mixture of at least one phosphorescent emitter and at least one compound of the formula (1) or formula (2) and at least one organic solvent.

The present invention still furthermore relates to the use of compounds of the formula (1) or formula (2) as matrix material for phosphorescent emitters in an organic electroluminescent device.

The organic electroluminescent devices according to the invention have the following surprising advantages over the prior art:

1. The organic electroluminescent devices according to the invention have very high efficiency.
2. The organic electroluminescent devices according to the invention simultaneously have an improved lifetime.
3. The organic electroluminescent devices according to the invention simultaneously have a reduced operating voltage.
4. The above-mentioned improved properties of the organic electroluminescent devices are obtained not only with tris-ortho-metallated metal complexes, but, in particular, also with complexes which also contain a ketoketonate ligand, for example acetylacetonate. In particular for complexes of this type, matrix materials in accordance with the prior art are still in need of improvement with respect to the efficiency, lifetime and operating voltage.

The invention is described in greater detail by the following examples, without wishing to restrict it thereby. The person skilled in the art will be able, without an inventive step, to prepare further compounds according to the invention and use them in organic electronic devices.

EXAMPLES

The following syntheses are carried out under a protective-gas atmosphere in dried solvents, unless indicated otherwise. The starting materials can be purchased from ALDRICH (potassium fluoride (spray-dried), tri-tert-butylphosphine, palladium(II) acetate). 3-Chloro-5,6-diphenyl-1,2,4-triazine can be prepared analogously to EP 577559. 2',7'-Di-tert-butylspiro-9,9'-bifluorene-2,7-bisboronic acid glycol ester can be prepared in accordance with WO 02/077060 and 2-chloro-4,6-diphenyl-1,3,5-triazine in accordance with U.S. Pat. No. 5,438,138. Spiro-9,9'-bifluorene-2,7-bis(boronic acid glycol ester) can be prepared analogously to WO 02/077060.

Example 1

Synthesis of 2,7-bis(4,6-diphenyl-1,3,5-triazin-2-yl)-2',7'-di-tert-butylspiro-9,9'-bifluorene (TRIAZINE 1)

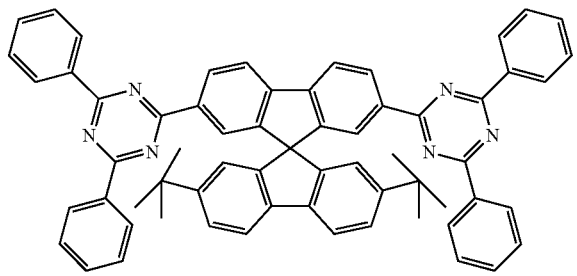 [SMILES: CC(C)(C)c1ccc2c(c1)C1(c3cc(-c4nc(-c5ccccc5)nc(-c5ccccc5)n4)ccc3-c3ccc(-c4nc(-c5ccccc5)nc(-c5ccccc5)n4)cc31)c1cc(C(C)(C)C)ccc1-2]

28.4 g (50.0 mmol) of 2',7'-di-tert-butylspiro-9,9'-bifluorene-2,7-bisboronic acid glycol ester, 29.5 g (110.0 mmol) of 2-chloro-4,6-diphenyl-1,3,5-triazine and 44.6 g (210.0 mmol) of tripotassium phosphate are suspended in 500 ml of toluene, 500 ml of dioxane and 500 ml of water. 913 mg (3.0 mmol) of tri-o-tolylphosphine and then 112 mg (0.5 mmol) of palladium(II) acetate are added to this suspension, and the reaction mixture is heated under reflux for 16 h. After cooling, the organic phase is separated off, filtered through silica gel, washed three times with 200 ml of water and subsequently evaporated to dryness. The residue is recrystallised from toluene and from dichloromethane/isopropanol and finally sublimed in a high vacuum (p=5×10−5 mbar, T=385° C.). The yield is 39.9 g (44.8 mmol), corresponding to 89.5% of theory.

Example 2

Synthesis of 2,7-bis(4,6-diphenyl-1,3,5-triazin-2-yl) spiro-9,9'-bifluorene (TRIAZINE2)

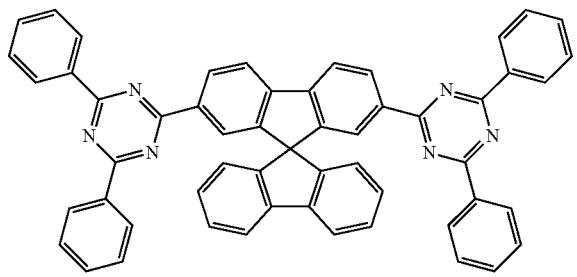 [SMILES: c1ccc(-c2nc(-c3ccccc3)nc(-c3ccc4c(c3)C3(c5ccccc5-c5ccccc53)c3cc(-c5nc(-c6ccccc6)nc(-c6ccccc6)n5)ccc3-4)n2)cc1]

The synthesis is carried out analogously to Example 1, with the 2',7'-di-tert-butylspiro-9,9'-bifluorene-2,7-bis(boronic acid glycol ester) being replaced by 22.8 g (50 mmol) of spiro-9,9'-bifluorene-2,7-bis(boronic acid glycol ester). The yield is 32.3 g (41.5 mmol), corresponding to 82.9% of theory.

Example 3

Synthesis of 2-(4,6-diphenyl-1,3,5-triazin-2-yl)spiro-9,9'-bifluorene (TRIAZINE3)

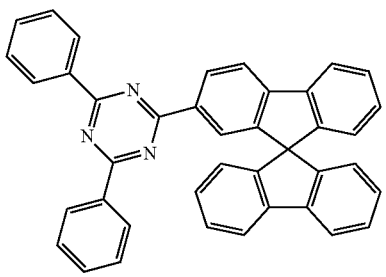 [SMILES: c1ccc(-c2nc(-c3ccccc3)nc(-c3ccc4c(c3)C3(c5ccccc5-c5ccccc53)c3ccccc3-4)n2)cc1]

a) Synthesis of spiro-9,9'-bifluorene-2-boronic acid 73.7 ml (184 mmol) of n-butyllithium (2.5 M in hexane) are added dropwise to a solution, cooled to −78° C., of 71 g (180 mmol) of 2-bromo-9-spirobifluorene in 950 ml of diethyl ether. The reaction mixture is stirred at −78° C. for min. The mixture is allowed to come to room temperature and is recooled to −78° C., and a mixture of 26.4 ml (234 mmol) of trimethyl borate in 50 ml of diethyl ether is then added rapidly. After warming to −10° C., the mixture is hydrolysed using 90 ml of 2 N hydrochloric acid. The organic phase is separated off, washed with water, dried over sodium sulfate and evaporated to dryness. The residue is taken up in 200 ml of n-heptane, and the colourless solid is filtered off with suction, washed with n-heptane and dried in vacuo. Yield: 63 g (170 mmol), 98% of theory; purity: 98% according to $^1$H-NMR.

b) Synthesis of 2-(4,6-diphenyl-1,3,5-triazin-2-yl) spiro-9,9'-bifluorene

The synthesis is carried out analogously to Example 1, with the 2',7'-di-tert-butylspiro-9,9'-bifluorene-2,7-bis(boronic acid glycol ester) being replaced by 28 g (50 mmol) of spiro-9,9'-bifluorene-2-boronic acid. The yield is 38 g (41.5 mmol), corresponding to 95.0% of theory.

Example 4

Production and Characterisation of Organic Electroluminescent Devices Comprising Triazine Compounds Electroluminescent devices according to the invention can be produced as described, for example, in WO 05/003253. The results for various OLEDs are compared here. The basic structure, the materials used, the degree of doping and the layer thicknesses thereof are identical for better comparability.

Examples 5-7, 12 and 15 describe comparative standards in accordance with the prior art, in which the emission layer consists of the host material (or matrix material) bis(9,9'-spirobifluoren-2-yl) ketone (SK) or BAlq or a 50:50 SK:CBP mixture and various guest materials (dopants) TER for red or TEG for green triplet emission. Furthermore, OLEDs which comprise the fluorenetriazine derivatives or spirobifluorenetriazine derivatives as host material are described. OLEDs having the following structure are produced analogously to the general process mentioned above:

Hole-injection layer (HIL) 20 nm of 2,2',7,7'-tetrakis(di-para-tolylamino)spiro-9,9'-bifluorene Hole-transport layer (HTL) 20 nm of NPB (N-naphthyl-N-phenyl-4,4'-diaminobiphenyl)

Emission layer (EML) 40 nm of host material: spiroketone (SK) (bis(9,9'-spirobifluoren-2-yl) ketone) or BAlq ((1,1'-biphenyl-4'-oxy)bis(8-hydroxy-2-methylquinolinato)aluminium) or SK and CBP (4,4'-bis(carbazol-9-yl)biphenyl) mixed in equal proportions as comparison or compounds according to the invention. Dopant: 15% by vol. doping; compounds see below Hole-blocking layer (HBL) 10 nm of SK (optional)

Electron conductor (ETL) 20 nm of AlQ$_3$ (tris(quinolinato)aluminium(III))

Cathode 1 nm of LiF, 100 nm of Al on top.

The structures of TER-1, TER-2, TEG, SK, BAlq, CBP are shown below for clarity.

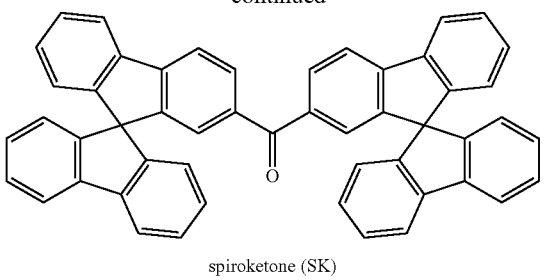

spiroketone (SK)

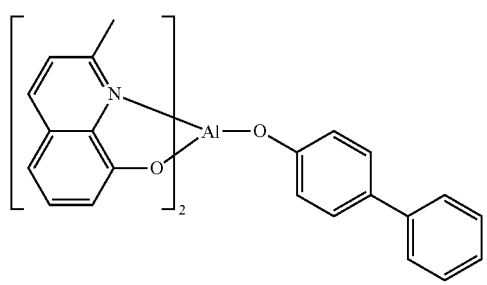

BAlq

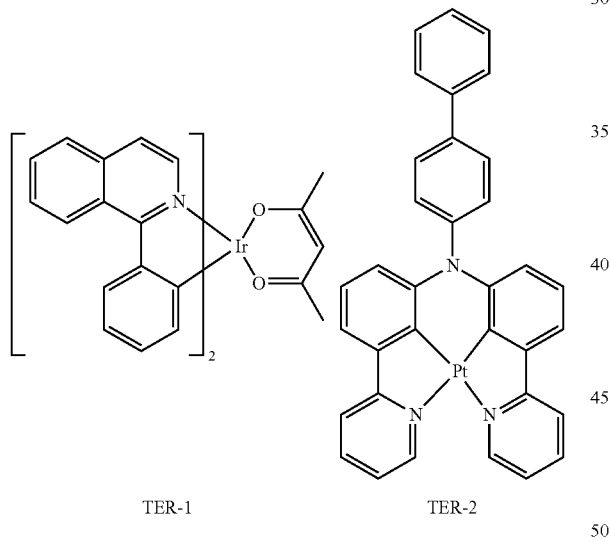

TER-1          TER-2

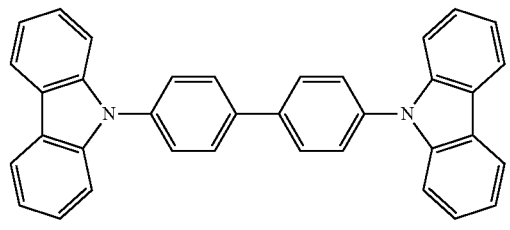

CBP

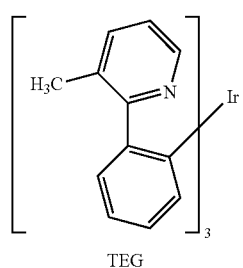

TEG

The triazines TRIAZINE2 and TRIAZINE3 used have the structures depicted above in Examples 2 and 3.

These as yet unoptimised OLEDs are characterised by standard methods; for this purpose, the electroluminescence spectra, the efficiency (measured in cd/A) as a function of the luminance, the operating voltage, calculated from current-voltage-luminance characteristic lines (IUL characteristic lines), and the lifetime are determined.

As can be seen from Tables 1 and 3, the devices exhibit superior behaviour in the efficiencies, voltages and lifetimes measured compared with the comparative devices comprising the host materials SK or BAlq. Furthermore, Table 2 shows that TRIAZINE2 and TRIAZINE3 are very highly suitable for forming a mixed host with carbazole-containing host materials (here CBP).

TABLE 1

Device results with TRIAZINE2 and TRIAZINE3 in combination with TER-1 or TER-2 as dopant

| Ex. | EML (no HBL) | Max. eff. [cd/A] at 1000 cd/m² | Voltage [V] at 1000 cd/m² | CIE (x, y) | Lifetime [h], initial luminance 1000 cd/m² |
|---|---|---|---|---|---|
| 5 comp. | SK:TER-1 | 5.6 | 4.9 | 0.69/0.31 | 3000 |
| 6 comp. | BAlq:TER-1 | 7.0 | 6.2 | 0.69/0.31 | 8500 |
| 7 comp. | SK:TER-2 | 6.8 | 5.6 | 0.66/0.33 | 14000 |
| 8 | TRIAZINE2:TER-1 | 7.5 | 4.8 | 0.68/0.32 | 18000 |
| 9 | TRIAZINE3:TER-1 | 7.2 | 5.0 | 0.69/0.31 | 14000 |
| 10 | TRIAZINE2:TER-2 | 9.8 | 6.5 | 0.66/0.33 | 21000 |
| 11 | TRIAZINE3:TER-2 | 9.0 | 6.5 | 0.66/0.33 | 18000 |

TABLE 2

Device results with TRIAZINE2 and TRIAZINE3 in combination with CBP and with TER-1 or TER-2 as dopant

| Ex. | EML (with HBL) | Max. eff. [cd/A] at 1000 cd/m² | Voltage [V] at 1000 cd/m² | CIE (x, y) | Lifetime [h], initial luminance 1000 cd/m² |
|---|---|---|---|---|---|
| 12 comp. | SK:CBP:TER-1 | 7.2 | 5.2 | 0.68/0.32 | 7000 |
| 13 | TRIAZINE2:CBP:TER-1 | 8.0 | 4.7 | 0.68/0.32 | 25000 |
| 14 | TRIAZINE3:CBP:TER-1 | 8.1 | 5.2 | 0.68/0.32 | 15000 |

TABLE 3

Device results with TRIAZINE3 in combination with TEG as dopant

| Ex. | EML (with HBL) | Max. eff. [cd/A] at 1000 cd/m² | Voltage [V] at 1000 cd/m² | CIE (x, y) | Lifetime [h], initial luminance 1000 cd/m² |
|---|---|---|---|---|---|
| 15 comp. | SK:TEG | 27 | 4.2 | 0.36/0.61 | 10000 |
| 16 | TRIAZINE3:TEG | 35 | 4.7 | 0.36/0.61 | 25000 |

The invention claimed is:

1. An organic electroluminescent device comprising, in at least one emitting layer,
   (A) at least one phosphorescent compound and
   (B) at least one compound of the formula (1) or formula (2):

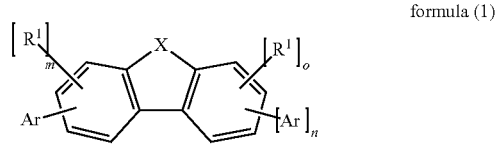

formula (1)

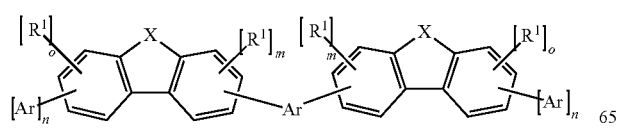

formula (2)

where the following applies to the symbols and indices used:

Ar is on each occurrence, identically or differently, a heteroaryl group selected from the group consisting of triazine, pyrazine, pyridazine, pyridine, pyrazole, imidazole, oxazole and thiazole, each of which may be substituted by one or more groups $R^1$;

X is on each occurrence, identically or differently, a group of the formula (3), where the dashed bond in each case indicates the bonding to the two benzene rings:

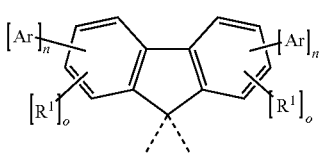

formula (3)

or X is on each occurrence, identically or differently, a divalent bridge selected from $B(R^1)$, $C(R^1)_2$, $Si(R^1)_2$, $C=C(R^1)_2$, O, S, S=O, $SO_2$, $N(R')$, $P(R^1)$ and $P(=O)R^1$;

$R^1$ is on each occurrence, identically or differently, H, D, F, Cl, Br, I, CHO, $N(Ar^1)_2$, $C(=O)Ar^1$, $P(=O)(Ar^1)_2$, $S(=O)Ar^1$, $S(=O)_2Ar^1$, $CR^2=CR^2Ar^1$, CN, $NO_2$, $Si(R^2)_3$, $B(OR^2)_2$, $B(R^2)_2$, $B(N(R^2)_2)_2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals $R^2$, where one or more, non-adjacent $CH_2$ groups is optionally replaced by $R^2C=CR^2$, $C\equiv C$, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms is optionally replaced by D, F, Cl, Br, I, CN or NO$_2$, or an aromatic or heteroaromatic ring system having 5 to 60 aromatic ring atoms, which is optionally in each case be substituted by one or more radicals R$^2$, or an aryloxy or heteroaryloxy group having 5 to 60 aromatic ring atoms, which is optionally substituted by one or more radicals R$^2$, or a combination of these systems; two or more adjacent substituents R$^1$ here may also form a mono- or polycyclic, aliphatic or aromatic ring system with one another;

Ar$^1$ is on each occurrence, identically or differently, an aromatic or heteroaromatic ring system having 5 to 30 aromatic ring atoms, which is optionally substituted by one or more radicals R$^2$; two radicals Ar$^1$ here which are bonded to the same nitrogen, phosphorus or boron atom are optionally linked to one another by a single bond or a bridge selected from the group consisting of B(R$^2$), C(R$^2$)$_2$, Si(R$^2$)$_2$, C=O, C=NR$^2$, C=C(R$^2$)$_2$, O, S, S=O, SO$_2$, N(R$^2$), P(R$^2$) and P(O)R$^2$;

R$^2$ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents R$^2$ here optionally form a mono- or polycyclic, aliphatic or aromatic ring system with one another;

n is 0 or 1;

m is 0, 1, 2 or 3;

o is 0, 1, 2, 3 or 4 if n=0 and is 0, 1, 2 or 3 if n=1.

2. The organic electroluminescent device according to claim 1, wherein the compound of the formula (1) or formula (2) is a fluorene derivative of the formula (4) or formula (5) or a spirobifluorene derivative of the formula (6) or formula (7):

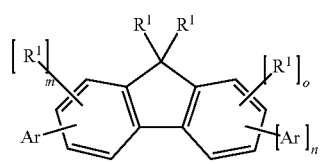

formula (4)

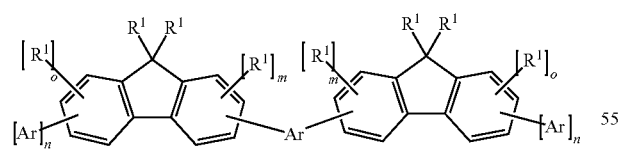

formula (5)

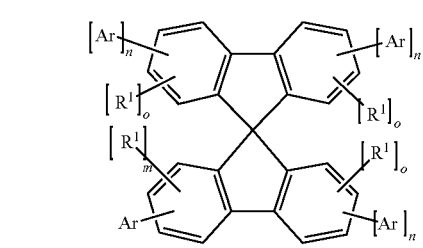

formula (6)

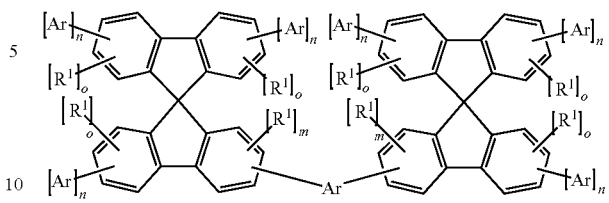

formula (7)

where the symbols and indices used have the same meanings as described in claim 1.

3. The organic electroluminescent device according to claim 2, wherein the monovalent group Ar is selected from the groups of the formulae (8) to (20), where the dashed bond in each case indicates the bonding of the group to the fluorene or spirobifluorene or to the corresponding heterocyclic derivative, and R$^1$ has the same meaning as described in claim 2, and in that the divalent group Ar in compounds of the formulae (2), (5) and (7) is selected from the groups of the formulae (21) to (28), where the dashed bonds in each case indicate the bonding of the group to the fluorene or spirobifluorene or to the corresponding heterocyclic derivative, and R$^1$ has the same meaning as described in claim 2:

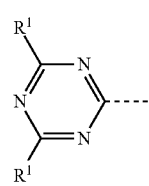

formula (8)

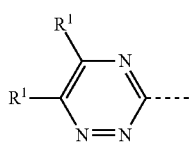

formula (9)

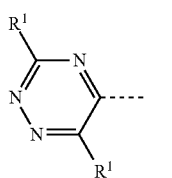

formula (10)

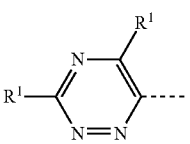

formula (11)

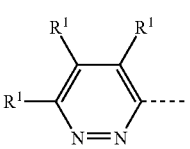

formula (12)

formula (13)
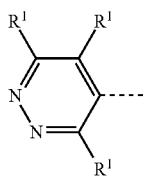

formula (14)
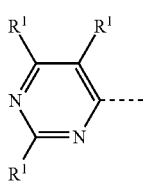

formula (15)
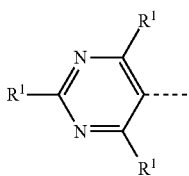

formula (16)
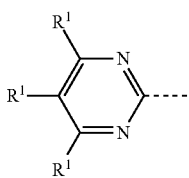

formula (17)
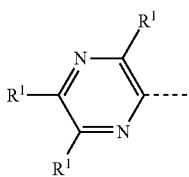

formula (18)
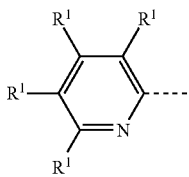

formula (19)
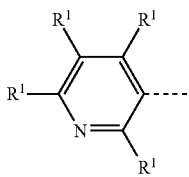

formula (20)
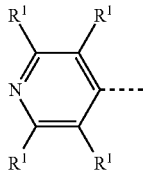

formula (21)
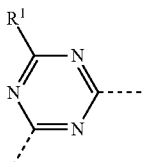

formula (22)
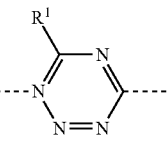

formula (23)
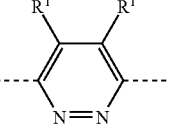

formula (24)
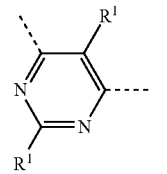

formula (25)
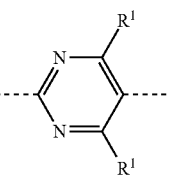

formula (26)
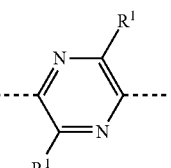

formula (27)
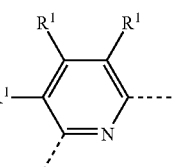

formula (28)
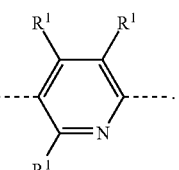

4. The organic electroluminescent device according to claim 3, wherein the radical $R^1$ which is bonded to the groups of the formulae (8) to (28) stands, identically or differently on each occurrence, for H or D, a straight-chain alkyl or alkoxy group having 1 to 10 C atoms or a branched or cyclic alkyl or alkoxy group having 3 to 10 C atoms, each of which is optionally substituted by one or more radicals $R^2$, Where one or more H atoms is optionally replaced by D or F, or an aromatic or heteroaromatic ring system having 5 to 30 aromatic ring atoms, which may in each case be substituted by one or more radicals $R^2$, or a combination of these systems.

5. The organic electroluminescent device according to claim 2, wherein the compound of the formula (1), (2) or (4) to (5) is selected from compounds of the formulae (29) to (32):

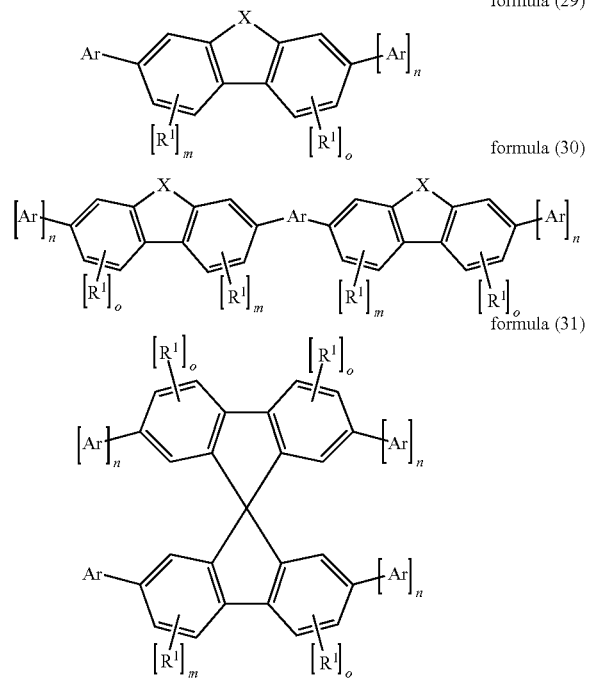

formula (29)

formula (30)

formula (31)

formula (32)

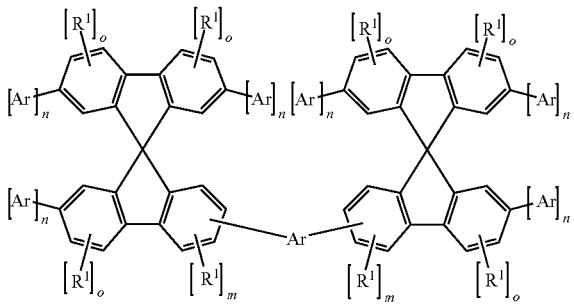

where the symbols and indices have the same meaning as described in claim 2, and where, for n=0, a substituent R¹ may also be bonded in the corresponding position.

6. The organic electroluminescent device according to claim 1, wherein the index m=0 and in that the sum of the indices n+o=0 or 1 on each benzene ring.

7. The organic electroluminescent device according to claim 1, wherein the compound of the formula (1) or formula (2) is selected from compounds of the formulae (33) to (36):

formula (33)

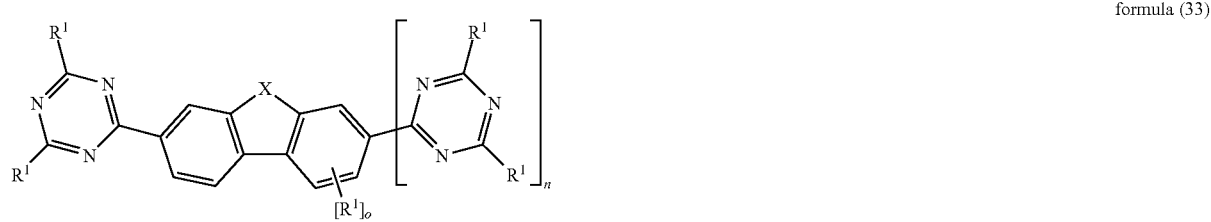

formula (34)

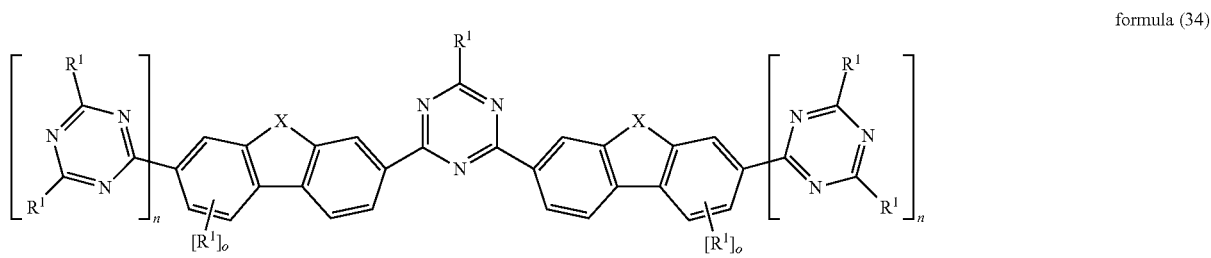

formula (35)

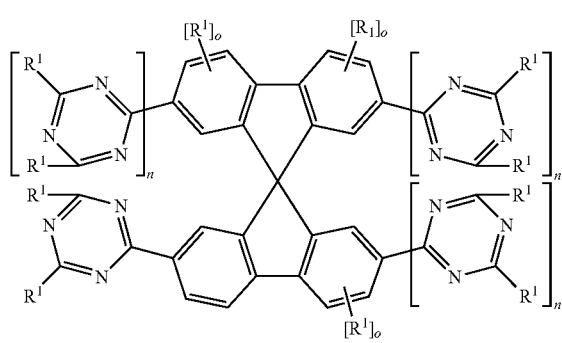

formula (36)

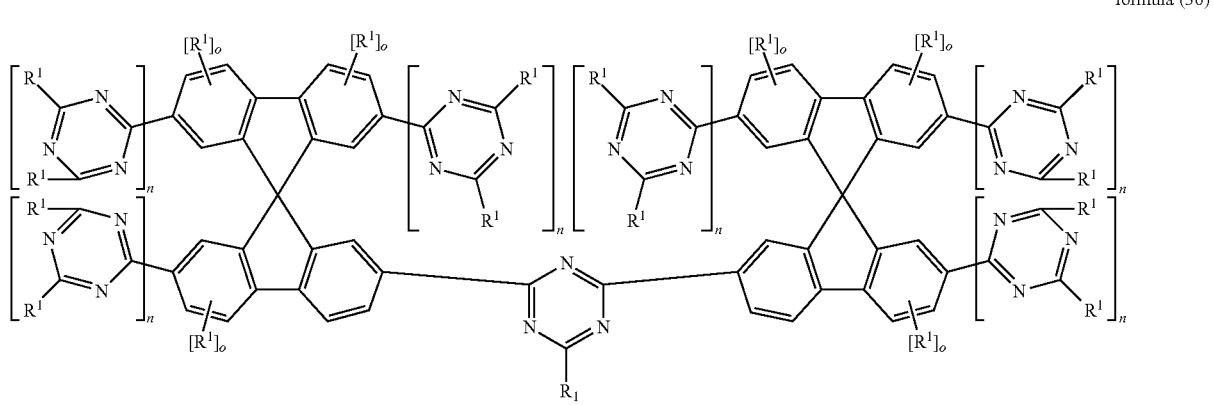

where the symbols and indices used have the meanings mentioned in claim 1, and furthermore n+o=0 or 1 on each benzene ring and where, for n=0 and o=1, the radical $R^1$ may be bonded to any desired free site on the benzene ring.

8. The organic electroluminescent device according to claim 7, wherein the compounds of the formula (35) are selected from compounds of the formulae (37), (38) and (39):

formula (37)

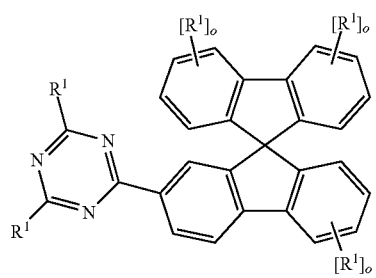

formula (38)

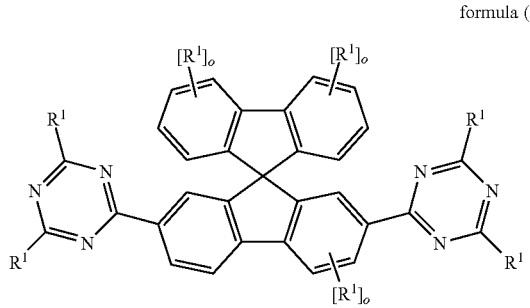

formula (39)

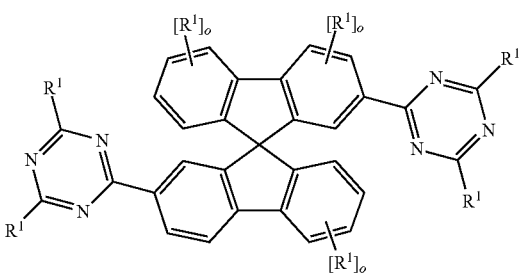

where the symbols used have the meanings mentioned above and o stands, identically or differently on each occurrence, for 0 or 1.

9. The organic electroluminescent device according to claim 1, wherein the phosphorescent compound is a compound which contains copper, molybdenum, tungsten, rhenium, ruthenium, osmium, rhodium, iridium, palladium, platinum, silver, gold or europium.

10. The organic electroluminescent device according to claim 1, wherein the phosphorescent compound is a compound which contains iridium or platinum.

11. The organic electroluminescent device according to claim 10, wherein the phosphorescent compound is selected from compounds of the formulae (40) to (43):

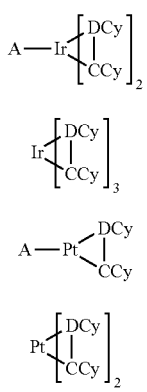

formula (40)

formula (41)

formula (42)

formula (43)

where $R^1$ has the same meaning as described in claim 10, and the following applies to the other symbols used:
DCy is, identically or differently on each occurrence, a cyclic group which contains at least one donor atom and which optionally carries one or more substituents $R^1$; the groups DCy and CCy are bonded to one another via a covalent bond;
CCy is, identically or differently on each occurrence, a cyclic group which contains a carbon atom via which the cyclic group is bonded to the metal and which may in turn carry one or more substituents $R^1$; and
A is, identically or differently on each occurrence, a monoanionic, bidentate chelating ligand.

12. The organic electroluminescent device according to claim 11, wherein
DCy is, identically or differently on each occurrence, a cyclic group which contains at nitrogen, carbon in the form of a carbene or phosphorus, via which the cyclic group is bonded to the metal and which optionally carries one or more substituents $R^1$; the groups DCy and CCy are bonded to one another via a covalent bond; and
A is, identically or differently on each occurrence, a diketonate ligand.

13. The organic electroluminescent device according to claim 1, which comprises an anode, a cathode and at least one emitting layer, and further layers selected from in each case one or more hole-injection layers, hole-transport layers, hole-blocking layers, electron-transport layers, electron-injection layers, electron-blocking layers, excitor-blocking layers, charge-generation layers, interlayers and/or organic or inorganic p/n junctions, where the layers are optionally doped.

14. The organic electroluminescent device according to claim 2, wherein the emitting layer, in addition to the phosphorescent compound and the compound of the formula (1) or (2), also comprises one or more further compounds.

15. The organic electroluminescent device according to claim 3, wherein the one or more further compounds are selected from the group consisting of triarylamines, carbazole derivatives, azacarbazoles and bipolar matrix materials.

16. A process for the production of the organic electroluminescent device according to claim 4, wherein one or more layers are produced by means of a sublimation process, by means of the OVPD (organic vapour phase deposition) process, with the aid of carrier-gas sublimation, by means of the OVJP (organic vapour jet printing) process, from solution or by means of a printing process.

17. A matrix material for phosphorescent compounds in an organic electroluminescent device which comprises the compounds of the formula (1) and (2)

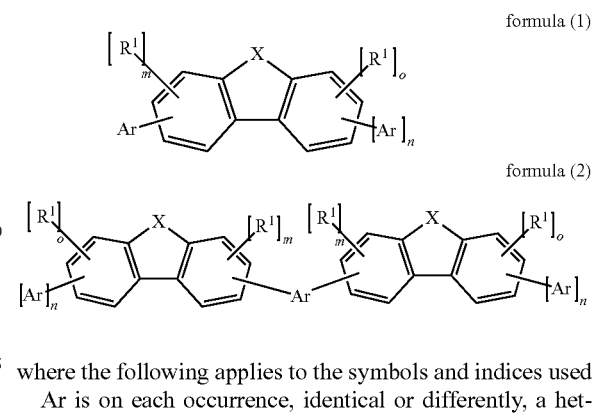

formula (1)

formula (2)

where the following applies to the symbols and indices used
Ar is on each occurrence, identical or differently, a heteroaryl group selected from the group consisting of triazine, pyrazine, pyridazine, pyridine, pyrazole, imidazole, oxazole, and thiazole, each of which may be substituted by one or more groups $R^1$;
X is on each occurrence, identically or differently, a group of the formula (3), where the dashed bond in each case indicates the bonding to the two benzene rings:

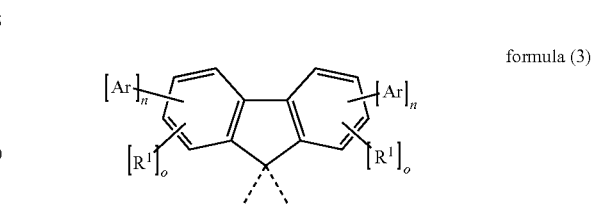

formula (3)

or X is on each occurrence, identically or differently, a divalent bridge selected from $B(R^1)$, $C(R^1)_2$, $Si(R^1)_2$, $C=C(R^1)_2$, O, S, S=O, $SO_2$, $N(R^1)$, $P(R^1)$ and $P(=O)R^1$;
$R^1$ is on each occurrence, identically or differently, H, D, F, Cl, Br, I, CHO, $N(Ar^1)_2$, $C(=O)Ar^1$, $P(=O)(Ar^1)_2$, $S(=O)Ar^1$, $S(=O)_2Ar^1$, $CR^2=CR^2Ar^1$, CN, $NO_2$, $Si(R^2)_3$, $B(OR^2)_2$, $B(R^2)_2$, $B(N(R^2)_2)_2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals $R^2$, where one or more, non-adjacent $CH_2$ groups is optionally replaced by $R^2C=CR^2$, $C=C$, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms is optionally replaced by D, F, Cl, Br, I, CN or $NO_2$, or an aromatic or heteroaromatic ring system having 5 to 60 aromatic ring atoms, which is optionally in each case be substituted by one or more radicals $R^2$, or an aryloxy or heteroaryloxy group having 5 to 60 aromatic ring atoms, which is optionally substituted by one or more radicals $R^2$, or a combination of these systems; two or more adjacent substituents $R^1$ here may also form a mono- or polycyclic, aliphatic or aromatic ring system with one another;
$Ar^1$ is on each occurrence, identically or differently, an aromatic or heteroaromatic ring system having 5 to 30 aromatic ring atoms, which is optionally substituted by one or more radicals $R^2$; two radicals $Ar^1$ here which are bonded to the same nitrogen, phosphorus or boron atom are optionally linked to one another by a single bond or a bridge selected from the group consisting of $B(R^2)$, C(R$^2$)$_2$, Si(R$^2$)$_2$, C=O, C=NR$^2$, C=C(R$^2$)$_2$, O, S, S=O, SO$_2$, N(R$^2$), P(R$^2$) and P(=O)R$^2$;

R$^2$ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents R$^2$ here optionally form a mono- or polycyclic, aliphatic or aromatic ring system with one another;

n is 0 or 1;
m is 0, 1, or 3;
o is 0, 1, 2, 3 or 4 if n=0 and is 0, 1, 2 or 3 if n=1.

18. A mixture comprising at least one compound of the formula (1) or (2)

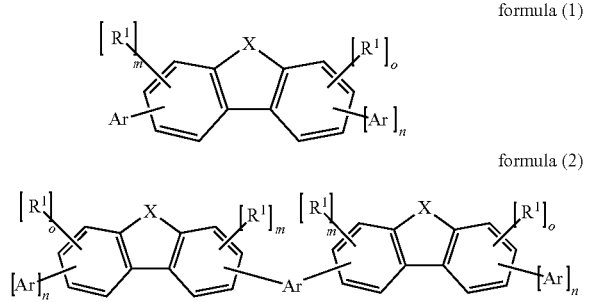

formula (1)

formula (2)

where the following applies to the symbols and indices used:

Ar is on each occurrence, identical or differently, a heteroaryl group selected from the group consisting of triazine, pyrazine, pyridazine, pyridine, pyrazole, imidazole, oxazole, and thiazole, each of which may be substituted by one or more groups R$^1$;

X is on each occurrence, identically or differently, a group of the formula (3), where the dashed bond in each case indicates the bonding to the two benzene rings:

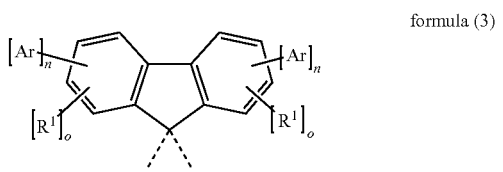

formula (3)

or X is on each occurrence, identically or differently, a divalent bridge selected from B(R$^1$), C(R$^1$)$_2$, Si(R$^1$)$_2$, C=C(R$^1$)$_2$, O, S, S=O, SO$_2$, N(R$^1$), P(R$^1$) and P(=O)R$^1$;

R$^1$ is on each occurrence, identically or differently, H, D, F, Cl, Br, I, CHO, N(Ar$^1$)$_2$, C(=O)Ar$^1$, P(=O)(Ar$^1$)$_2$, S(=O)Ar$^1$, S(=O)$_2$Ar$^1$, CR$^2$=CR$^2$Ar$^1$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals R$^2$, where one or more, non-adjacent CH$_2$ groups is optionally replaced by R$^2$C=C$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by D, F, Cl, Br, I, CN or NO$_2$, or an aromatic or heteroaromatic ring system having 5 to 60 aromatic ring atoms, which is optionally in each case be substituted by one or more radicals R$^2$, or an aryloxy or heteroaryloxy group having 5 to 60 aromatic ring atoms, which is optionally substituted by one or more radicals R$^2$, or a combination of these systems; two or more adjacent substituents R$^1$ here may also form a mono- or polycyclic, aliphatic or aromatic ring system with one another;

Ar$^1$ is on each occurrence, identically or differently, an aromatic or heteroaromatic ring system having 5 to 30 aromatic ring atoms, which is optionally substituted by one or more radicals R$^2$; two radicals Ar$^1$ here which are bonded to the same nitrogen, phosphorus or boron atom are optionally linked to one another by a single bond or a bridge selected from the group consisting of B(R$^2$), C(R$^2$)$_2$, Si(R$^2$)$_2$, C=O, C=NR$^2$, C=C(R$^2$)$_2$, O, S, S=O, SO$_2$, N(R$^2$), P(R$^2$) and P(O)R$^2$;

R$^2$ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents R$^2$ here optionally form a mono- or polycyclic, aliphatic or aromatic ring system with one another;

n is 0 or 1;
m is 0, 1, 2 or 3;
o is 0, 1, 2, 3 or 4 if n=0 and is 0, 1, 2 or 3 if n=1;
and at least one phosphorescent compound.

19. A solution comprising the mixture according to claim 18 and at least one organic solvent.

20. The organic electroluminescent, device according to claim 4, wherein the phosphorescent compound is selected from compounds of the formulae (40) to (43):

formula (40)

formula (41)

formula (42)

formula (43)

wherein

DCy is, identically or differently on each occurrence, a cyclic group which contains at least one donor atom and which optionally carries one or more substituents R$^1$; the groups DCy and CCy are bonded to one another via a covalent bond;

CCy is, identically or differently on each occurrence, a cyclic group which contains a carbon atom via which the cyclic group is bonded to the metal and which may in turn carry one or more substituents R$^1$;

A is, identically or differently on each occurrence, a monoanionic, bidentate chelating ligand;

R$^1$ is on each occurrence, identically or differently, H, D, F, Cl, Br, I, CHO, N(Ar)$_2$, C(=O)Ar$^1$, P(=O)(Ar$^1$)$_2$, S(=O)Ar$^1$, S(=O)$_2$Ar$^1$, CR$^2$=CR$^2$Ar$^1$, CN, NO$_2$, $Si(R^2)_3$, $B(OR^2)_2$, $B(R^2)_2$, $B(N(R^2)_2)_2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals $R^2$, where one or more, non-adjacent $CH_2$ groups is optionally replaced by $R^2C=CR^2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms is optionally replaced by D, F, Cl, Br, I, CN or $NO_2$, or an aromatic or heteroaromatic ring system having 5 to 60 aromatic ring atoms, which is optionally in each case be substituted by one or more radicals $R^2$, or an aryloxy or heteroaryloxy group having 5 to 60 aromatic ring atoms, which is optionally substituted by one or more radicals $R^2$, or a combination of these systems; two or more adjacent substituents $R^1$ here may also form a mono- or polycyclic, aliphatic or aromatic ring system with one another;

$Ar^1$ is on each occurrence, identically or differently, an aromatic or heteroaromatic ring system having 5 to 30 aromatic ring atoms, which is optionally substituted by one or more radicals $R^2$; two radicals $Ar^1$ here which are bonded to the same nitrogen, phosphorus or boron atom are optionally linked to one another by a single bond or a bridge selected from the group consisting of $B(R^2)$, $C(R^2)_2$, $Si(R^2)_2$, $C=O$, $C=NR^2$, $C=C(R^2)_2$, O, S, $S=O$, $SO_2$, $N(R^2)$, $P(R^2)$ and $P(=O)R^2$; and $R^2$ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents $R^2$ here optionally form a mono- or polycyclic, aliphatic or aromatic ring system with one another.

\* \* \* \* \*